United States Patent
Beach et al.

(10) Patent No.: US 8,697,581 B2
(45) Date of Patent: Apr. 15, 2014

(54) III-NITRIDE SEMICONDUCTOR DEVICE WITH TRENCH STRUCTURE

(75) Inventors: Robert Beach, Altadena, CA (US); Paul Bridger, Sleepy Hollow, NY (US)

(73) Assignee: International Rectifier Corporation, El Segundo, CA (US)

(*) Notice: Subject to any disclaimer, the term of this patent is extended or adjusted under 35 U.S.C. 154(b) by 662 days.

(21) Appl. No.: 12/217,830

(22) Filed: Jul. 9, 2008

(65) Prior Publication Data

US 2008/0274621 A1 Nov. 6, 2008

Related U.S. Application Data

(62) Division of application No. 11/004,192, filed on Dec. 3, 2004, now Pat. No. 7,439,555.

(60) Provisional application No. 60/527,636, filed on Dec. 5, 2003, provisional application No. 60/549,639, filed on Mar. 3, 2004, provisional application No. 60/623,678, filed on Oct. 29, 2004.

(51) Int. Cl.
*H01L 21/302* (2006.01)

(52) U.S. Cl.
USPC .............. 438/708; 216/37; 216/67; 438/700; 438/701; 438/703; 438/704; 257/192; 257/194; 257/E29.252

(58) Field of Classification Search
USPC .............. 216/37, 67; 257/192, 194, E29.252; 438/708, 700–705
See application file for complete search history.

(56) References Cited

U.S. PATENT DOCUMENTS

| 4,024,560 A | 5/1977 | Miller et al. |
| 4,152,711 A | 5/1979 | Nakata |
| 4,194,934 A * | 3/1980 | Blaske et al. ................ 438/542 |
| 4,839,310 A | 6/1989 | Hollis et al. |
| 5,753,938 A | 5/1998 | Thapar et al. |
| 6,294,016 B1 * | 9/2001 | Kim et al. ........................ 117/4 |
| 6,486,511 B1 * | 11/2002 | Nathanson et al. ........... 257/328 |
| 6,486,567 B2 * | 11/2002 | Sano et al. ..................... 307/32 |
| 6,580,141 B2 | 6/2003 | Hshieh et al. |
| 6,699,760 B2 * | 3/2004 | Hsu et al. ...................... 438/285 |
| 6,864,131 B2 | 3/2005 | Thornton |
| 2002/0182791 A1 | 12/2002 | Yoshida |

OTHER PUBLICATIONS

Youtsey et al. Electronics Letters, vol. 33, No. 3, (1997) pp. 1-2.*
Wurfl et al. Microelectronics Reliability, vol. 39, (1999), pp. 1737-1757.*

(Continued)

*Primary Examiner* — Nadine G Norton
*Assistant Examiner* — Maki Angadi
(74) *Attorney, Agent, or Firm* — Farjami & Farjami LLP

(57) ABSTRACT

A III-nitride trench device has a vertical conduction region with an interrupted conduction channel when the device is not on, providing an enhancement mode device. The trench structure may be used in a vertical conduction or horizontal conduction device. A gate dielectric provides improved performance for the device by being capable of withstanding higher electric field or manipulating the charge in the conduction channel. A passivation of the III-nitride material decouples the dielectric from the device to permit lower dielectric constant materials to be used in high power applications.

20 Claims, 15 Drawing Sheets

(56) References Cited

OTHER PUBLICATIONS

Gila B.P. et al. Journal of Vacuum Science & Technol. B 21(6), Nov./Dec. 2003, pp. 2368-2370.*

Gila et al. Journal of Vacuum Science and Technology, B 21(6), Nov./Dec. (2003), pp. 2368-2370.*

Caverly Robert, et al. Microwave journal, pp. 1-17, (2001).*

O. Ambacher et al., Two-dimensional electron gases induced by spontaneous and piezoelectric polarization charges in N- and Ga-face AlGaN/GaN heterostructues, Journal of Applied Phys. vol. 85, No. 6, Mar. 15, 1999 (pp. 3222-3233).

AlGaN/GaN Heterojunction Bipolar Transistor, L.S. McCarthy, P. Kozodoy, M.J.W. Rodwell, S.P. DenBaars, U.K. Mishra, IEEE Electron Device Letters, vol. 20, No. 6, Jun. 1999.

* cited by examiner

III-NITRIDE SEMICONDUCTOR DEVICE WITH TRENCH STRUCTURE

RELATED APPLICATION

The present application is a divisional of U.S. patent application Ser. No. 11/004,192, filed Dec. 3, 2004, entitled III-Nitride Semiconductor Device with Trench Structure which is based on and claims priority to U.S. Provisional Application No. 60/527,636, filed Dec. 5, 2003, entitled III-Nitride MISFET, and U.S. Provisional Application No. 60/549,639, filed Mar. 3, 2004, entitled Vertical Channel III-Nitride and U.S. Provisional Application No. 60/623,678, filed Oct. 29, 2004, entitled III-Nitride Semiconductor Device With Trench Structure, to all of which a claim of priority is hereby made, and the disclosures of which are hereby incorporated herein by reference.

BACKGROUND OF THE INVENTION

1. Field of the Invention

The present invention relates generally to a trench device realized in a III-nitride material system, and relates more particularly to a class of trench switching devices that are nominally off in a III-nitride material system.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential. The nominally on nature of the HEMT devices previously fabricated have limited their applicability to power management. The limitations of nominally on power devices is observed in the need to have a control circuit powered and operational, before power can be safely controlled by a nominally on device. Accordingly, it would be desirable to create a III-nitride heterojunction device that is nominally off to avoid current conduction problems during start-up and other modes.

A drawback of III-nitride devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer, for example. Some previous designs have focused on reducing the in-plane lattice constant of the AlGaN layer to near where the point of relaxation occurs to reduce the dislocation generation and leakage. However, the problem of limited thickness is not addressed by these designs.

Another solution is to add insulation layers to prevent leakage problems. The addition of an insulator layer can reduce the leakage through the barrier, and typical layers used for this purpose are silicon oxide, silicon nitride, sapphire, or other insulators, disposed between the AlGaN and metal gate layers. This type of device is often referred to as a MISHFET and has some advantages over the traditional devices that do not have an insulator layer.

While additional insulator layers can permit thicker strained AlGaN/GaN systems to be constructed, the confinement layer produced by the additional insulator results in lower current carrying capacity due to the scattering effect produced on electrons at the GaN/insulator interface. Also, the additional interface between the AlGaN layer and the insulator results in the production of interface trap states that slow the response of the device. The additional thickness of the oxide, plus the additional interfaces between the two layers, also results in the use of larger gate drive voltages to switch the device.

Conventional device designs using nitride material to obtain nominally off devices rely on this additional insulator to act as a confinement layer, and may reduce or eliminate the top AlGaN layer. These devices, however, typically have lower current carrying capacity due to scattering at the GaN/insulator interface.

Accordingly, it would be desirable to produce a heterojunction device or FET that has a low leakage characteristic with fewer interfaces and layers that can still withstand high voltage and produce high current densities with low resistive losses. Presently, planar devices have been fabricated with GaN and AlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), sapphire and silicon. Silicon substrates are readily available and relatively inexpensive, and silicon processing technology has been well developed.

However, forming gallium nitride materials on silicon substrates to produce semiconductor devices presents challenges that arise from differences in the lattice constant, thermal expansion and bandgap between silicon and gallium nitride. The problems attendant with the lattice mismatch between GaN and traditional substrate materials are also prevalent in material layer structures involving GaN and GaN alloys. For example, GaN and AlGaN materials have lattice structures that differ significantly enough to produce interface strain between the layers, contributing to piezoelectric polarization. In many previous devices, the fields generated by the piezoelectric polarization are controlled to improve the characteristics of the devices. Variations in the content of aluminum in the AlGaN/GaN layer structures tends to vary the lattice mismatch between the materials to achieve different device characteristics, such as improved conductivity or isolation barriers.

A number of types of power devices can potentially benefit from a nominally off device with low on resistance. For example, it would be desirable to obtain a power switch, power rectifier, synchronous rectifier, current control device or other power devices that are nominally off when no power is applied. Current control devices can include diodes, pinch resistors, Schottky diodes and the like.

Trench structure semiconductor devices have been available in silicon for a number of years. Often, vertical conduction devices are realized with trench structures that can be formed in silicon as enhancement mode or nominally off devices. The devices, such as a MOSFET switch, typically operate by introducing an electric potential on a gate electrode to form an invertible channel along trench sidewalls, that provides a conductive path for the device. However, the conductive path typically has a given on resistance that is associated with the device voltage rating. For example, the thickness, composition and doping of the device materials contributes to determining device characteristics. These design parameters are manipulated to obtain desired characteristics, but on-resistance and blocking voltage for a given current rated device continue to receive attention for improvements to power semiconductor devices. It would be desirable to obtain a vertical conduction device with reduced on resistance that is capable of blocking large voltages.

One factor that contributes to the breakdown voltage value for a given device is the dielectric breakdown value for a given dielectric in the power semiconductor. For example, in silicon semiconductors, native oxides are available, such as silicon dioxide, that can serve as a suitable gate dielectric. However, no material equivalent to the native oxides for silicon is available for suitable gate dielectrics in the III-nitride material system. In addition, gate dielectric materials that would otherwise be suitable in silicon semiconductors, for example, do not transfer well to III-nitride devices. For example, if silicon dioxide or silicon nitride were to be used for a gate dielectric in a III-nitride device, these conventional dielectrics would rupture or otherwise fail. Typically, the large dielectric breakdown field produced in the III-nitride material system causes large electric fields in the III-nitride semiconductor devices that are greater than can be withstood with conventional dielectric materials.

It would be desirable to obtain a device structure and gate dielectric material suitable for use in a semiconductor device that experiences high electrical fields, without the dielectric material breaking down. It would also be desirable to obtain such a dielectric that is suitable for use in the III-nitride material system.

SUMMARY OF THE INVENTION

In accordance with the present invention, there is provided a nominally off, or enhancement mode FET device, realized in a III-nitride material system. The FET is capable of carrying high currents due to the nature of the III nitride material system, where piezoelectric and spontaneous polarization fields contribute to forming a 2DEG that permits high carrier mobility and large current throughput.

According to one embodiment of the present invention, a nominally off switch is formed with a trench geometry, to permit a 2DEG to be controlled along trench sidewalls. The trench geometry interrupts the 2DEG when the device is inactive to provide an enhancement mode, or nominally off device. Activation of the device, for example through application of an electric potential to a gate contact near the trench sidewalls, causes a 2DEG to form at the trench sidewalls, providing a conduction path for the device.

In accordance with a feature of the present invention, the trench geometry includes angled sidewalls at a particular angle. The angle of the trench sidewalls is controlled to obtain a particular threshold voltage for the device. As the angle becomes shallower so that the sidewalls become more lateral in direction, the threshold voltage decreases. Steeper sidewall angles produce higher threshold voltages. In an exemplary embodiment, the sidewalls are lined with AlGaN and formed at a particular angle to achieve a desired threshold voltage.

In accordance with a feature of the present invention, there is provided a FET device and method for operation that includes III-nitride material alloy layers. Alloys with particular percentages of In, Al or Ga may be used, with the nitrides InN, AlN or GaN and various alloy combinations such as, for example, InAlGaN. The device includes a source, a drain and a gate electrode. The device may be vertical or horizontal in operation for current paths.

According to an embodiment of the present invention, a III-nitride semiconductor device is composed of a multilayer stack of III-nitride materials grown on an appropriate substrate. The stack may consist of alternate layers of N and P type doped III-nitride materials. An example of such a multilayer stack includes $N^+GaN/P\ GaN/N^-GaN/N^+Gan$/substrate. Although such a multilayer stack may employ GaN as a material, any of the III-nitride material system compositions may be employed, including AlN, InN, AlGaN, InAlGaN, and any other appropriate alloy. Various types of alloys can be employed in the different layers of the stack to obtain particular characteristics and provide particular advantages from the heterojunction effects.

According to an embodiment of the present invention, a III-nitride semiconductor device is composed of a multilayer stack of III-nitride materials grown on an appropriate substrate. The stack may consist of alternate layers of III-nitride materials having different alloy percentages to produce different bandgaps. An example of such a multilayer stack includes GaN and AlGaN layers alternating with multiple 2DEGs formed at the layer interfaces to provide a high current conduction structure. The stack may consist of a superlattice structure, and may be composed of any of the III-nitride material system compositions, including AlN, InN, AlGaN, InAlGaN, and any other appropriate alloy. Various types of alloys can be employed in the different layers of the stack to obtain particular characteristics and provide particular advantages from the heterojunction effects.

Advantageously, cladding and contact layers may be grown above or below the active region. Other known processes for constructing electrodes, insulation layers and so forth may also be applied to the present invention.

According to a feature of the present invention, a good GaN insulator interface is provided to improve current carrying capacity, rather than additional insulator layers or structures at the active layer. Without added insulation layers, the epitaxial nature of the hetero-interface described here leads to an order of magnitude higher mobility for the electrons in the 2DEG when accumulated.

According to another embodiment of the present invention, a nominally off bi-directional switch realized in a III-nitride material system provides an AlGaN/GaN interface to provide a location for the formation of a 2DEG. A vertical AlGaN layer is provided that lines a trench in which a gate contact is disposed to eliminate the 2DEG locally to obtain an enhancement mode device. Application of an electric potential to the gate contact permits the 2DEG to be established and form a current conduction channel.

According to another feature of the present invention, a method for forming the above described devices is provided where a III-nitride structure is formed on an insulative or highly resistive substrate. Optionally, a buffer layer may be provided between the substrate and a III-nitride body layer, which is preferably composed of $N^-$ GaN. The buffer layer may also be composed of a III-nitride multilayer stack with alternating types of III-nitride materials to form a high current carrying region. The buffer layer may include a superlattice structure, for example. A layer of P type III-nitride material, preferably GaN, is deposited over the body layer. A layer of $N^+$ III-nitride material, preferably GaN, is then deposited over the P type material. A trench is formed in the III-nitride structure that projects into the body layer. A III-nitride layer with a different alloy percentage and lattice constant or band gap than that of the underlying layers, for example AlGaN, is deposited over the trench structure to line the trench and mesas. The top layer may then be patterned and etched, to remove particular portions of the top III-nitride layer as desired.

Ohmic contacts are then formed atop the III-nitride layer, with appropriate annealing steps to activate the ohmic contacts. An insulation layer is then deposited and patterned, which fills the trench and provides a protective layer over the remaining III-nitride structure surfaces. The insulator deposited in the trench is then etched to form a gate trench, into which is deposited conductive material to form the gate electrode. Additional cladding or contact layers may be formed in a vertical or horizontal relationship with the active regions. For example, known processes for constructing electrodes and insulation layers may be applied in forming the III-nitride device.

According to a feature of the present invention, the layer lining the trenches and the mesas is composed of multiple layers, or stacks. An exemplary embodiment includes a layered liner composed of layers of InGaN and AlGaN. Alternately, the liner is a lattice matched alloy with a larger bandgap.

According to another feature of the present invention, a trench device with a body or base layer composed of P GaN or compensated GaN is provided.

According to another embodiment of the present invention, a method for constructing a III-nitride structure is provided where the structure comprises a semiconductor device on a conductive substrate. The substrate is preferably $N^+$ material, overlaid by $N^+$ GaN. The $N^+$ GaN forms a buffer layer, and may be composed of materials with a gradient composition, multiple layers or multiple buffer layers. The buffer layer is overlaid by an $N^-$ GaN layer, which in turn is overlaid by a P GaN layer. The III-nitride structure is then overlaid by an $N^+$ GaN layer, and a trench is formed through the $N^+$ GaN layer, the P GaN layer and into the $N^-$ GaN layer. A layer of AlGaN is then deposited over the trench structure to line the trenches and the mesas. Ohmic contacts may then be formed on the layer of AlGaN. An insulator may then be deposited and patterned atop the III-nitride structure, with the insulator material filling the trench. The insulator in the trench is etched to reform a trench opening so that the trench opening has sidewalls composed of insulator material. A conductive gate material is deposited into the trench opening to form the gate contact for the device. The device may then be finished with cladding and other contact or electrode structures, using known processes. Insulation or protective layers may also be provided to encapsulate the structure to passivate the surfaces or prevent damage to the surfaces of the device.

In accordance with another exemplary embodiment of the present invention, a source region is formed with an intrinsic III-nitride material alloy, for example GaN, and overlaid with a larger bandgap III-nitride material alloy, for example AlGaN. Such a configuration permits the formation of a 2DEG in the source region to obtain high current capacities.

According to another embodiment of the present invention, a method for constructing a FET in a III-nitride material system provides for overlaying a substrate with a compensated N type GaN epi layer, which is overlaid by a lightly doped N type epi layer. The lightly doped N type epi layer is overlaid by a P type epi layer, followed by the deposition of a heavily doped N type epi layer. This initial III-nitride FET structure is used as the basis for forming a FET, or other semiconductor devices according to particular processing steps. A contact deposition is provided on the structure to form contacts on a top and bottom layer of the III-nitride structure. The contact on the top is patterned and etched to form the desired contact structure. After surface passivation of the device following the etch step, a gate dielectric is deposited, followed by the deposition of a gate contact. The resulting device may then be completed according to known steps, including providing cladding or other contact or electrode structures and insulation as desired.

In accordance with another embodiment of the present invention, a method for forming a FET device in a III-nitride material system begins with the formation of a P or N type epi layer over a substrate, followed by the formation of a dielectric portion, which may act as a gate dielectric. Ion implantation follows, to form gate and source semiconductor portions in regions not protected by the dielectric layer. That is, it is possible to use the dielectric layer as a mask for the deposition of the doped source and drain regions. Source and drain contacts are then formed, followed by an anneal step to activate the contacts. The protective dielectric layer may then be removed, the surface of the III-nitride device passivated, and the gate dielectric redeposited. A gate contact may be deposited atop the gate dielectric, to permit the formation of a 2DEG under the gate to form a current conduction channel between the source and the drain when the gate is activated.

According to another embodiment of the present invention, a method for constructing a FET in a III-nitride material system provides for an initial starting wafer that may comprise layers of $N^+$ GaN, P GaN, $N^-$ GaN, $N^+$ GaN and a substrate. The wafer is selectively etched to expose various layers, as well as to provide insulation for devices and channel fabrication. A redeposition step is employed to grow a layer of larger band gap III-nitride material over the wafer. This particular step provides a number of improvements in device performance by increasing the carrier mobility at the interface between the wafer and the larger band gap material. The addition of the larger band gap material is optional, and is not required for operation of the device. N type ohmic contacts are then formed and annealed to provide contacts with low resistivity. A gate structure is formed and may be composed of an insulating material such as SiN, $SiO_2$ or other insulating material deposited on the III-nitride larger band gap material. A conductive gate material is then formed over the insulator and the insulator and conductive gate material are patterned to provide a particular structure to achieve desirable characteristics according to the application. Devices formed according to this method can be provided in a number of different geometries, including striped, grid and cellular, including circular, oval, square, polygonal or other cellular geometries.

The large dielectric breakdown field in the III-nitride semiconductor material system permits the construction of nominally off power devices described above with reduced size standoff regions. The material system also permits the production of devices with reduced specific on resistance in comparison with known devices of similar voltage ratings.

According to one embodiment of the present invention, a nominally off FET device with a gate, source and drain area are defined using a two layer AlGaN/GaN material to produce a III-nitride HEMT device. The source and drain regions may be formed according to known methods including ion implantation, etching to remove the barrier region over the source and drain regions and application of a low resistance ohmic contact formation process.

According to another embodiment of the present invention, a vertical trench device is provided with AlGaN material lining the trench. Layers of GaN on the mesa portion of the device produce a 2DEG at the GaN/AlGaN interface, which can be controlled through a gate contact to control vertical conduction. Various configurations of trench geometries, including cellular and striped can be used to realize the device. In addition, the dimensions and doping concentration of the GaN layers produce particular device characteristics. Trenches and mesas may be lined with various III-nitride alloys or layers, including InGaN, AlGaN and GaN, in various combinations. The device exhibits low on resistance with high current carrying capability and high blocking voltage capability.

The device is also characterized by low leakage in the contacts and a high dielectric constant of the gate dielectric. As a result, the device provides a larger dielectric constant compared to conventional insulators such as $SiO_2$ and SiN. The high critical fields of the GaN material allow thin layers to withstand large voltages without dielectric breakdown. The dielectric constant of GaN materials is approximately 10, which is a factor of 2.5 times better than $SiO_2$.

In accordance with another aspect of the present invention, a self passivating surface structure for III-nitride materials is provided where the interface between materials is nearly ideal. The self passivation effect permits the gate dielectric to be decoupled from the semiconductor material, so that a wide choice of materials may be used for the gate dielectric. Examples of gate dielectrics that may be used are zirconium oxide, lanthenoid group oxides, diamond, AlN and other piezoelectric and pyroelectric materials.

In accordance with another aspect of the present invention, a III-nitride semiconductor surface may be repassivated according to the self passivation effect. Any number of devices may be fabricated using this effect to provide a good dielectric structure that is capable of resisting high electric fields without breakdown and serve to reduce the electric field on the gate.

In accordance with a method of the present invention, a surface passivation is performed prior to the deposition of a gate dielectric. According to a feature of the present invention, the surface passivation includes a nitrogen plasma anneal. In accordance with another feature of the present invention, the passivation process includes using an encapsulant material containing nitrogen followed by an anneal. According to a further feature of the present invention, the passivation may be performed with a photo-electro-chemical etch.

Other features and advantages of the present invention will become apparent from the following description of the invention which refers to the accompanying drawings.

DETAILED DESCRIPTION OF THE PREFERRED EMBODIMENTS

In the construction of GaN material devices, a number of factors come into play to impact the functionality and capability of the devices. A large lattice mismatch in III-nitride materials and the strong piezoelectric and polarization effects in these materials significantly impact the electrical properties of III-nitride heterojunction devices. A significant number of reported GaN-based devices to date use strained GaN/AlGaN junctions with alloy compositions that are designed to relieve the strain to avoid dislocations that may be responsible for long term instabilities in the devices. Various devices and systems for building heterojunction devices have been proposed to control the lattice mismatch and the strain of the GaN/AlGaN junctions. These devices are particularly designed to take advantage of piezoelectric and spontaneous polarization effects and to minimize long term instabilities.

GaN/AlGaN devices typically have one or more terminals for controlling electrical power flow in a given device. An electrical potential applied to a terminal controls the flow of current in an electrically conductive channel to which the terminal is coupled. The electrically conductive channel is defined by at least one heterointerface between two different semiconductor materials.

When AlGaN/GaN materials compose the semiconductor materials of a heterojunction device, and AlGaN is used as a barrier layer, polarization charges resulting from the spontaneous polarization properties of AlGaN as well as strain induced characteristics known as piezoelectric polarization fields are present. The control of the formation of these fields in the construction of a III-nitride device leads to different characteristics that make GaN-based devices suitable for a wide variety of applications depending upon how the device is characterized.

Heterojunction devices formed with GaN materials sometimes include a barrier layer of AlGaN that is disposed on the channel layer to induce a 2DEG that produces a high concentration of electrons in the channel to thereby enhance the electrically conductive properties of the channel. Due to the presence of the 2DEG formed at the interface of the AlGaN/GaN layers, fundamentally formed III-nitride devices are nominally on because the presence of the channel permits conduction of current between electrodes, for example.

Figure 1A:
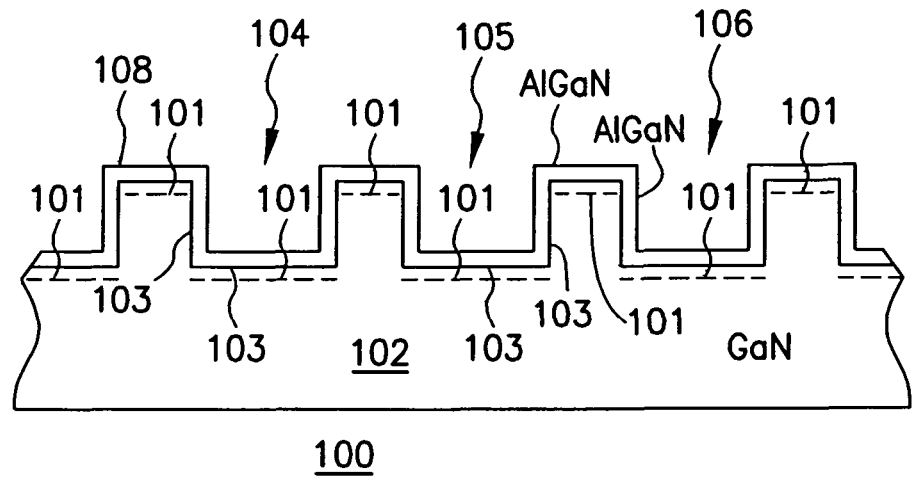
FIGS. 1A-1B are cross-sectional views of a partially formed III-nitride trench device in accordance with the present invention.

Referring now to FIG. 1A, an abstract view of a heterojunction trench device according to the present invention is illustrated as device 100. Device 100 includes a body region 102 composed of a III-nitride material, preferably GaN. A number of trenches 104-106 are formed in body layer 102 to provide recesses in body layer 102. Body layer 102 with trenches formed in it is overlaid with another III-nitride material layer 108, that has a different alloy percentage, lattice constant and bandgap than body layer 102. Preferably, material layer 108 is composed of AlGaN. Layer 108 covers mesas and sidewalls as well as bottoms of trenches 104-106 to form a particular geometry for an interface 103 between layers 102 and 108. In accordance with this geometry, a 2DEG 101 is formed at horizontal portions of interface 103 to provide intermittent high mobility conduction channels at interface 103. Note that no 2DEG is provided along sidewalls of trenches 104-106. Due to the lack of a 2DEG on sidewalls of trenches 104-106, no conduction takes place in a vertical or horizontal direction for device 100.

Device 100 is suitable for receiving a gate electrode in trenches 104-106. An electrical potential may be applied to these gate electrodes, which induces a 2DEG along the sidewalls of trenches 104-106. The induced 2DEG provides a completed conduction channel for device 100 along interface 103, so that device 100 is capable of conducting current in a horizontal or vertical direction. Due to the nature of the heterointerface 103, device 100 is nominally off because of the absence of a 2DEG along sidewalls of trenches 104-106. Owing to the resistant nature of layer 102, device 100 is capable of withstanding high voltages to permit device 100 to operate well as a power switching device.

Figure 1B:
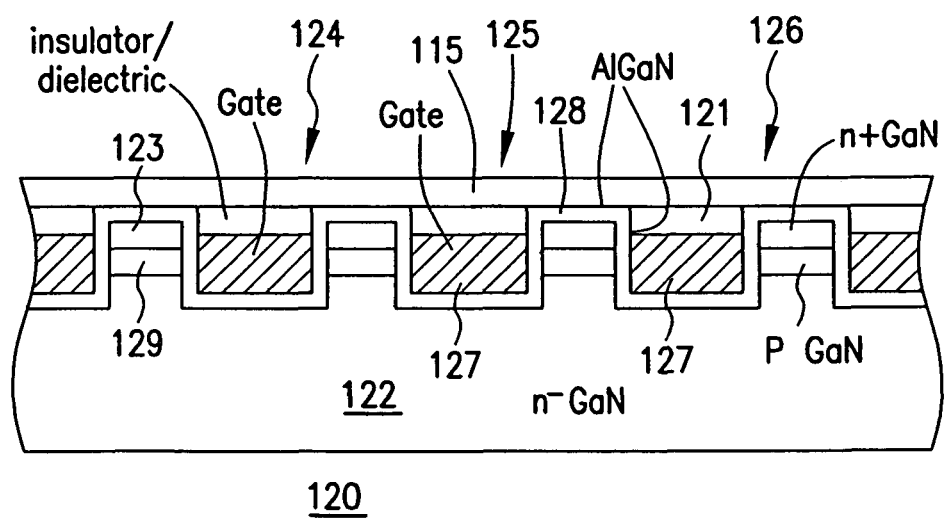

Referring now to FIG. 1B, an embodiment of a completed trench device 120 according to the present invention is illustrated. Device 120 includes a body layer 122, that may be composed of $N^-$ GaN. Prior to the formation of trenches 124-126 in body layer 122, a layer 129 of P type III-nitride material is provided on layer 122, atop which a layer 123 of highly doped $N^+$ III-nitride material is deposited. Trenches 124-126 are then formed in device 120 that extend through layers 123 and 129 and into layer 122. Device 120 is then overlaid with a layer 128 of III-nitride material that has a different alloy percentage, lattice constant and bandgap than that of III-nitride material layer 122. Preferably, layer 128 is composed of AlGaN. Gates 127 are formed in trenches 124-126, and capped with an insulator/dielectric 121. A contact layer 115 may then be deposited and patterned over device 120 to form an ohmic contact with layer 128. Various types of passivation and processing techniques may be used in conjunction with the formation of contact layer 115 to provide a good, low resistance ohmic contact for device 120. According to a particular embodiment of the present invention, contact 115 can operate as a source contact in a FET device.

In operation, device 120 is nominally off when no electrical potential is applied to gate electrodes 127. Application of an electric potential to gate electrode 127 causes the formation of a 2DEG along sidewalls of trenches 124-126. In conjunction with the already formed 2DEG at the tops of the mesas and the bottom of trenches 124-126. At that point, device 120 becomes conductive and provides a high current capacity conduction channel that can be oriented horizontally or vertically. Highly doped $N^+$ layer 123 supplies a number of carriers that can enhance the conduction of the channel formed by the 2DEG in the sidewalls of trenches 124-126. P type layer 129 can be designed to have particular characteristics to control such parameters as on resistance and threshold voltage.

Device 120 can be constructed with the III-nitride devices having any particular geometry. Accordingly, the trenches may be formed as stripes, in grid patterns, or in cellular formats, such as circular, polygonal, square and so forth. In addition, trenches 104-106 are shown with vertical sidewalls; i.e. normal to a horizontal plane. It should be noted that the sidewalls of trenches 104-106 can be at any desired angle other than normal. By varying the angle of the orientation of the sidewalls the threshold voltage of the device can be varied.

Referring now to FIGS. 2A-2G, another embodiment according to the present invention is illustrated as a vertical conduction device 130. Initial device 130 may be preformed as a wafer structure upon which further processing steps may be carried out. Device 130 is provided as an exemplary embodiment of a III-nitride structure formed on an $N^+$ substrate 132, that may be composed of any suitable material including silicon and silicon carbide, for example. A highly doped III-nitride layer 133 is provided on substrate 132, preferably composed of $N^+$ GaN. A lightly doped body layer composed of a III-nitride material is provided over layer 133, where body layer 134 is preferably composed of $N^-$ GaN. Another III-nitride layer 135 is provided over body layer 134, where layer 135 is a P doped III-nitride material, preferably P GaN. A highly doped III-nitride layer 136 is provided on layer 135, where layer 136 is also preferably composed of $N^+$ GaN.

Figure 2A:
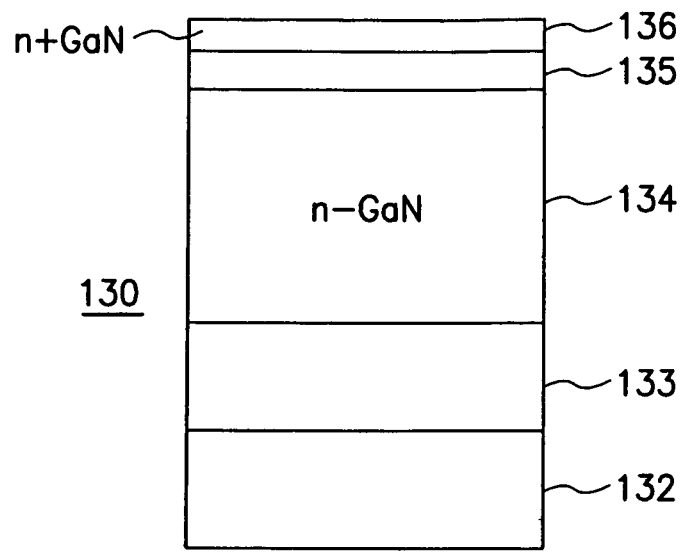
FIGS. 2A-2G are cross sectional views that illustrate a trench device and method for forming the same in accordance with the present invention.
Figure 2B:
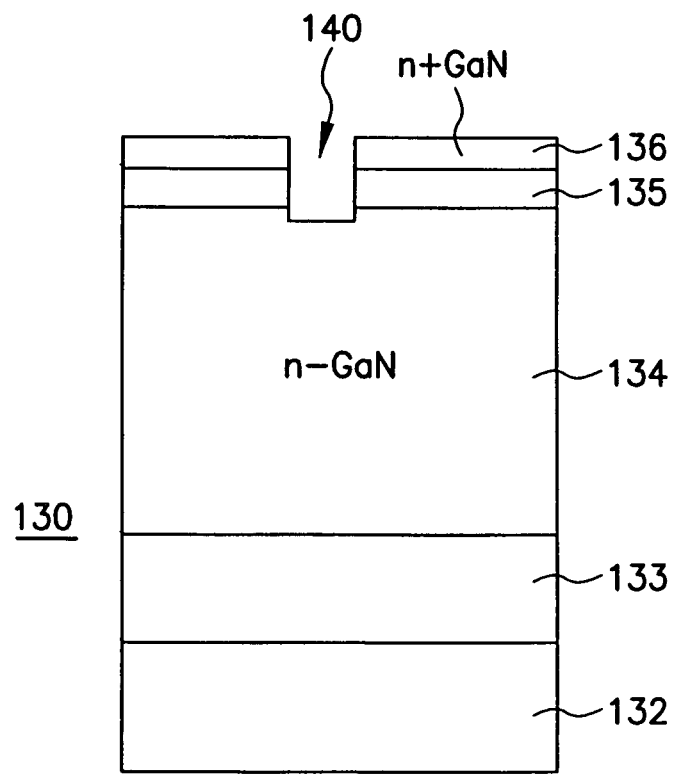

Referring now to FIG. 2B, a trench 140 is etched into III-nitride device 130 to pierce layers 136 and 135, and protrude into layer 134. Any type of suitable technique for forming trench 140 may be used, including etching or other processes suitable for use with the III-nitride material system.

Figure 2C:
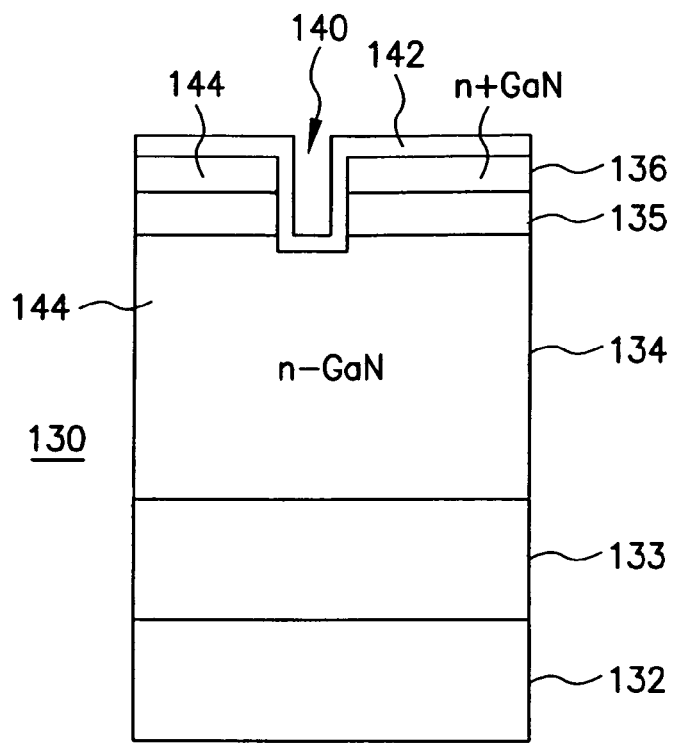

Referring now to FIG. 2C, a III-nitride layer 142 is deposited over the top of device 130, and into trench 140, and covers sidewalls of trench 140. Layer 142 is composed of a III-nitride material that has a different alloy percentage, lattice constant or bandgap than layers 134, 135 and 136. Preferably, layer 142 is formed with AlGaN. The AlGaN layer forms a heterointerface with layers 134-136, and provides a 2DEG at horizontal interface portions 144 to form a high mobility conduction channel. The deposition of layer 142 may be achieved according to a number of techniques, including PECVD and sputtering, for example. Optionally, a thin protective layer may be provided atop device 130 prior to the deposition of layer 142 to prevent the outdiffusion of nitrogen from the III-nitride material layers 134-136 during the annealing of ohmic contacts formed in a layer step.

Figure 2D:
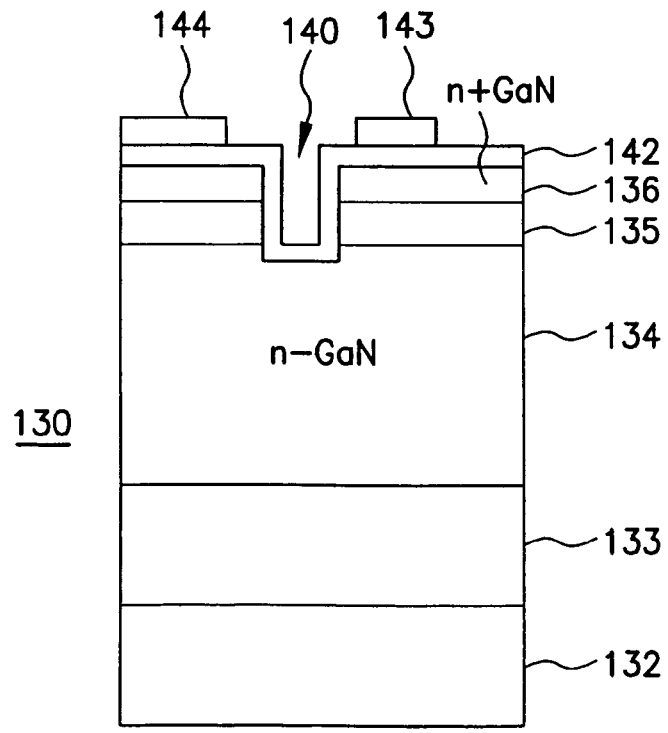

Referring now to FIG. 2D, ohmic contacts 142, 143 are formed atop layer 142 of device 130. The deposition of the ohmic contact material may be achieved according to any known method, and may include an annealing step to decrease the contact resistance of ohmic contacts 142, 143. Since device 130 is a vertical conduction device, ohmic contacts 142, 143 act as sources for current input into device 130. Current flows through ohmic contacts 142, 143, along sidewalls of trench 140 and through layers 132-134 when device 130 is conducting.

Figure 2E:
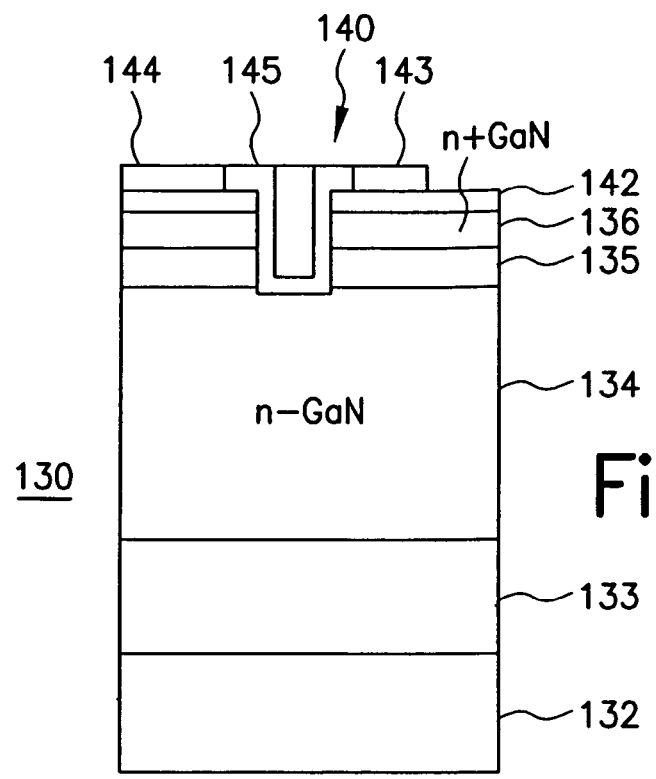

Referring now to FIG. 2E, an insulator 145 is deposited atop device 130 and into trench 140, and will act as a gate dielectric for device 130. Insulator 145 is patterned to expose ohmic contacts 143, 144, while providing a good insulation distance between subsequent gate contact formation and ohmic contacts 143, 144. Insulator 145 may be deposited according to any known technique, and may be composed of traditional materials, such as silicon dioxide or silicon nitride, or dielectric materials that exhibit a much higher dielectric constant and high electric field breakdown characteristics, such as zirconium oxide, lanthanoid group oxides, diamond, AlN and piezoelectric as well as pyroelectric materials. Low temperature dielectric deposition techniques may be used with oxide such as GD oxide or MG oxide. The dielectric used may have a high dielectric constant and may reduce the electric field experienced by the gate electrode.

Figure 2F:
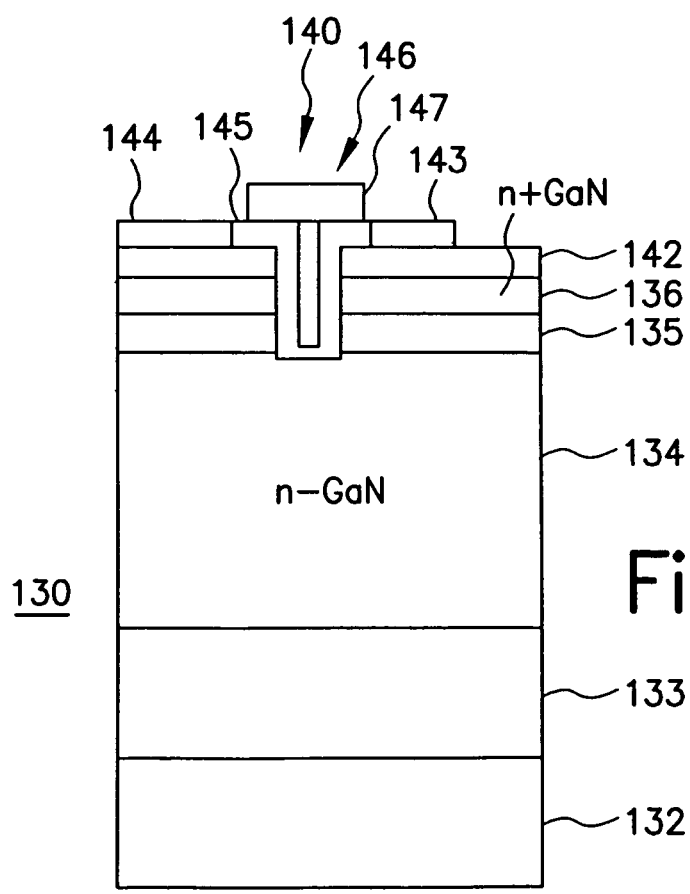

Referring now to FIG. 2F, device 130 with insulator 145 deposited is subjected to a process to form a trench 146 in insulator 145 and within trench 140 to permit the deposition of a gate electrode material. Trench 146 is formed in insulator 145 to provide insulator material lining trench 140, so that insulator 145 provides for the isolation of the gate contact from layer 142. It should be noted that insulator 145 may be formed initially with a trench 146 according to the dielectric material used to form insulator 145. For example, insulator 145 may be deposited using TEOS or other processes that provide a dielectric lining in trench 140. The dimensions and composition of insulator 145 may also be modified to produce particular device characteristics, such as a desired on resistance or threshold voltage. Once trench 146 is suitably prepared, a conductive gate material 147 is deposited atop insulator 145 and into trench 146. Any particular known technique for depositing gate electrode 147 may be used, and gate contact 147 may be composed of various conductive metals or semiconductor material, depending on desired characteristics. In accordance with a special feature of the present invention, the structure represented by device 130 may be repeated a number of times on a semiconductor die that is formed on a wafer. Accordingly, devices 130 may be joined together in parallel, or may be isolated from each other and operated independently with different connections to gate electrode 147.

Figure 2G:
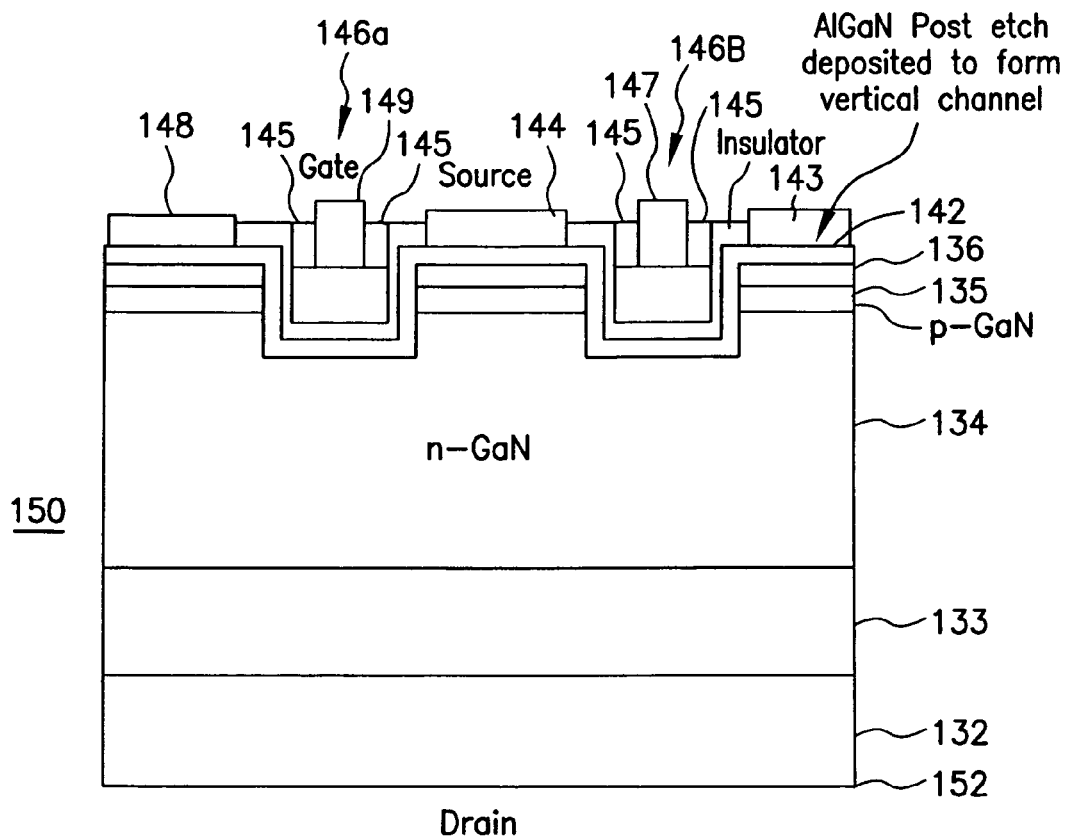

Referring now to FIG. 2G, a device 150 is illustrated and is formed according to the processes used to form device 130, and also includes the formation of a drain contact 152. Device 150 includes two gate electrodes 147, 149 that may be operated simultaneously or independently.

Device 150 operates as a nominally off, enhancement mode device, because no conduction channel is formed between the source and drain due to the absence of a 2DEG at the sidewalls of trenches 146a and 146b. A conduction channel, or 2DEG, exists along horizontal portions of the interface between layers 142 and layers 136, 134. However, because of the geometry of layer 142 in trenches 146a, 146b, the 2DEG is interrupted and vertical portions of the interface between layer 142 and layers 134-136.

The application of an electrical potential to gate contacts 147, 149, induces an invertible channel to locally invert P type material in layer 135 to an N type conductor, forming a conduction channel between layers 134 and 136 along sidewalls of trenches 146a, 146b. The conduction channel is formed as a 2DEG that connects with the conduction channels formed under source contacts 143, 144 and 148, as well as the conduction channels formed under gates 147, 148. Through the formation of a channel, device 150 begins to conduct current between source contacts 143, 144, 148 and drain contact 152. Because of the completed conduction channel along layer 142, device 150 is also capable of conducting current in a horizontal direction, where current may be propagated through device 150 with a degree of dispersion or balance, permitting greater current densities and throughput.

Figures 3A, 3B:
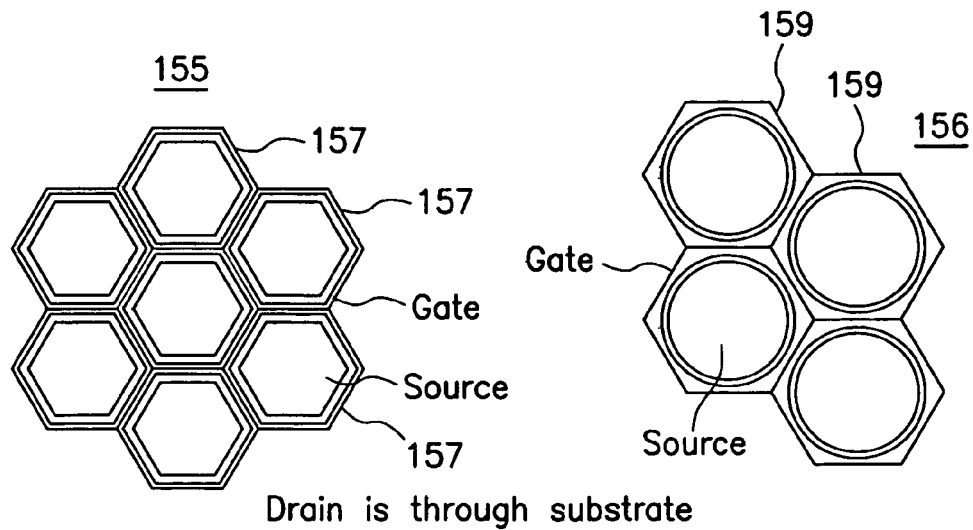
FIGS. 3A-3B are plan views of trench devices having particular geometries in accordance with the present invention.

Referring now to FIGS. 3A and 3B, cellular geometries for devices 155 and 156, respectively are illustrated. Device 155 is formed according to polygonal cellular geometries, in this case hexagonal, where each cell is closely coupled to a neighboring cell. It should be noted that the term polygonal is meant to refer to a generally polygonal shape, it is not meant to be limited to a strict polygonal interpretation, but may include polygonal shapes with rounded vertices, which may result from diffusion or other manufacturing processes to form device 155. The geometry of device 155 permits gate contacts 157 to be joined together easily, so that each cell operates in unison to form a device that has a single overall response, i.e., a single connection for each of a source, a drain and a gate contact.

Referring now to FIG. 3B, cellular device 156 include source contacts that are arranged in a circular geometry, surrounded by circular insulator material, and hexagonally shaped gate contacts 159, which may take the shape of polygons with rounded corners or vertices, as discussed above. The circular shaped source contacts may provide advantages with regard to the generation of an electric field or breakdown voltage, and may derive other benefits from ease of manufacturing. It should be apparent that devices 155, 156 are exemplary embodiments of device geometry for a vertical conduction device, and a number of other geometries are readily available. For example, while devices 155, 156 are illustrated as having hexagonal symmetry to form an array of devices, square, rectangular, linear and other alternate geometries are readily available. In addition, while hexagonal and circular devices are shown, linear, oval and other alternative shapes for individual devices is also contemplated to be within the scope of the present invention.

Referring now to FIGS. 4A-4I, another embodiment of the present invention is illustrated as a horizontal conduction device 160. Device 160 is composed of a resistive or insulating substrate 162, overlaid by a III-nitride multilayer stack 163, and N⁻ III-nitride body layer 164, a P III-nitride 165 and a highly doped N⁺ III-nitride layer 166. Layers 164-166 are substantially similar to the counterpart vertical conduction devices 130-150, and layers 164-166 are capable of conducting current in a vertical direction. The III-nitride material used to construct layers 164-166 is preferably GaN.

Multilayer stack 163 is composed of alternating III-nitride materials, where one III-nitride material is alternated with a III-nitride material that has a different in-plane lattice constant. The different in-plane lattice constant of the two alternating III-nitride materials forms a number of conduction channels at the interface between the alternating materials due to the 2DEG at the heterointerface. Accordingly, stack 163 is capable of carrying large amounts of current that can be delivered through layers 164-166.

Figure 4A:
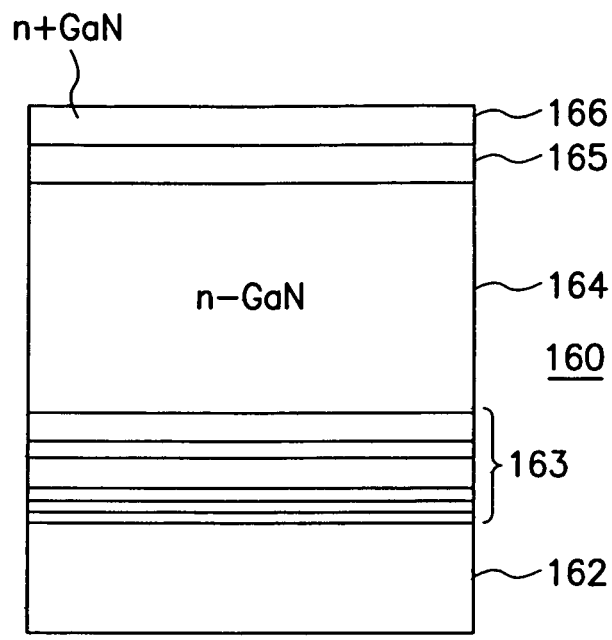
FIGS. 4A-4I are cross sectional views of a trench device and method for forming the same in accordance with the present invention.
Figure 4B:
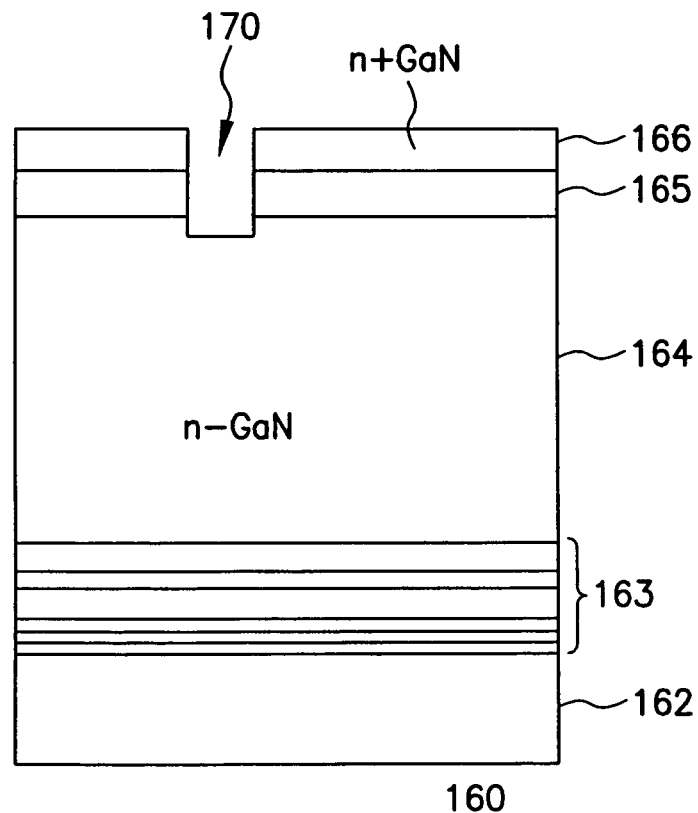
Figure 4C:
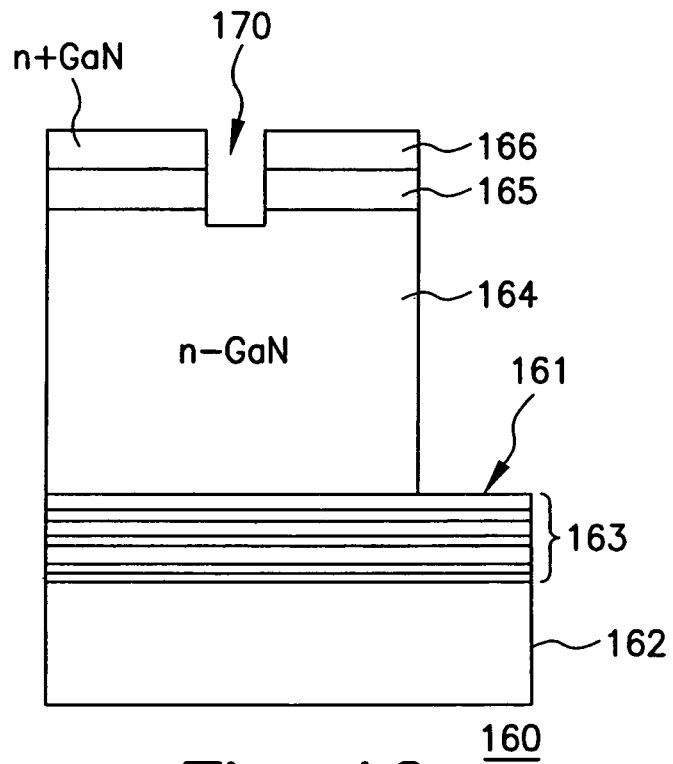

Referring now to FIG. 4B, device 160 is illustrated with a trench 170 formed through the upper layers of device 160. Trench 170 is formed through layers 165, 166, and protrudes into layer 164, and provides an initial structure for the formation of a gate contact. Referring now to FIG. 4C, layers 164-166 are etched, or otherwise processed to remove a portion of the layers overlying stack 163. This processing step may be carried out according to known techniques for manufacturing semiconductor devices, and in particular III-nitride devices. The same is true of the formation of trench 170, where various known processes may be used in the formation of the trench structure. During this step, stack 163 is exposed at a step 161, suitable for the formation of contacts discussed in greater detail below. Stack 163, composed of alternating III-nitride materials preferably is constructed with alternating layers of GaN and AlGaN. It should be apparent, however, that other III-nitride materials may be employed to construct stack 163, including those discussed above.

Figure 4D:
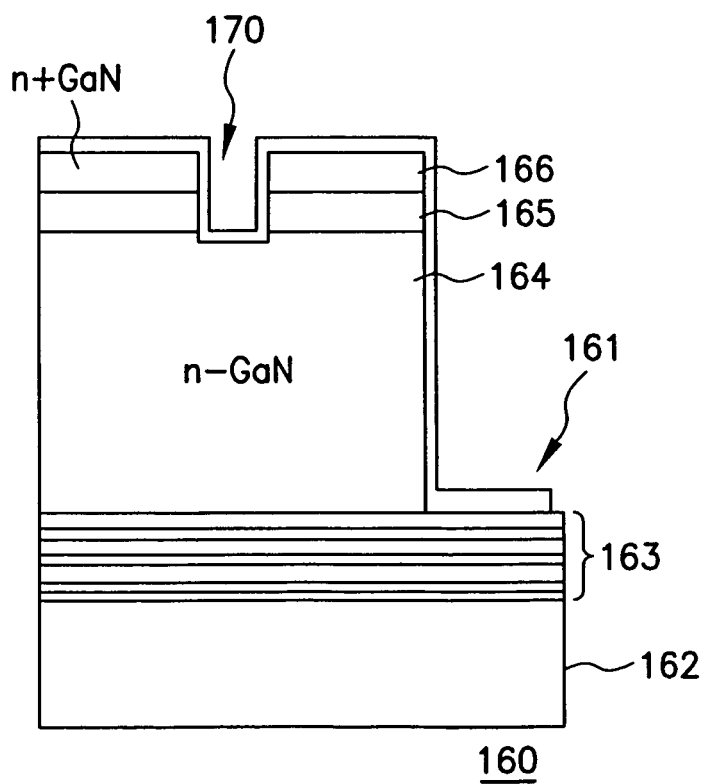

Referring now to FIG. 4D, a III-nitride material layer 172 is formed over device 160. Layer 172 is a III-nitride material that has a smaller in-plane lattice constant than material used to form layers 164-166. Preferably, layer 172 is composed of AlGaN. Layer 172 is deposited to line trench 170 so that the bottom and sidewalls of trench 170 are covered by layer 172. Because of the different in-plane lattice constants between layer 172 and layers 164-166, a high mobility 2DEG is formed in horizontal portions of the interface between layer 172 and layers 164-166. Accordingly, a 2DEG is formed below the bottom of trench 170, and between horizontal portions of layer 172 and layer 166. Layer 172 may be deposited according to any known method, including PECVD and sputtering. A protective or insulative layer may be deposited over device 160 prior to the deposition of layer 172 to protect layers 164-166 from outdiffusion during high temperature processing that is typically associated with the formation of ohmic contacts, discussed below.

Figure 4E:
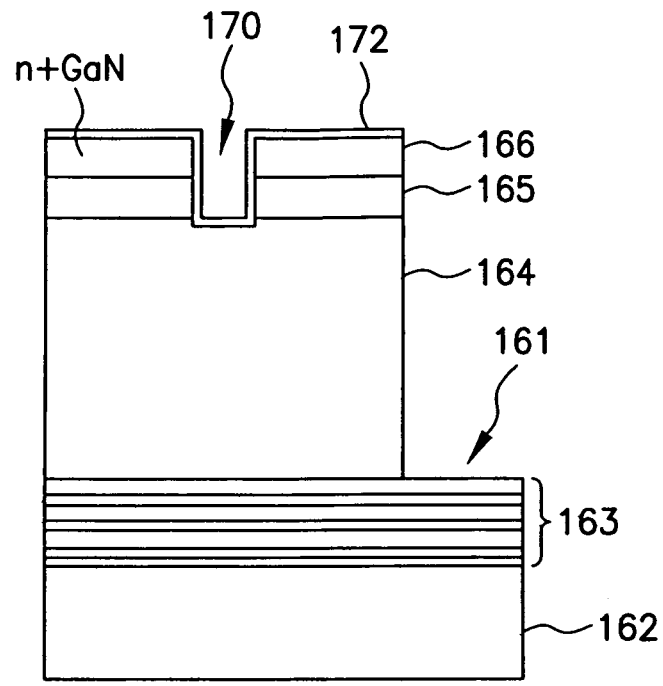

Referring now to FIG. 4E, device 160 is processed to remove layer 172 in the vertical and horizontal portions of step 161. This operation may be accomplished through well known masking and etching techniques, for example. After the process for removing the portions of layer 172 near step 161, a portion of stack 163 is exposed at step 161 for further processing.

Figure 4F:
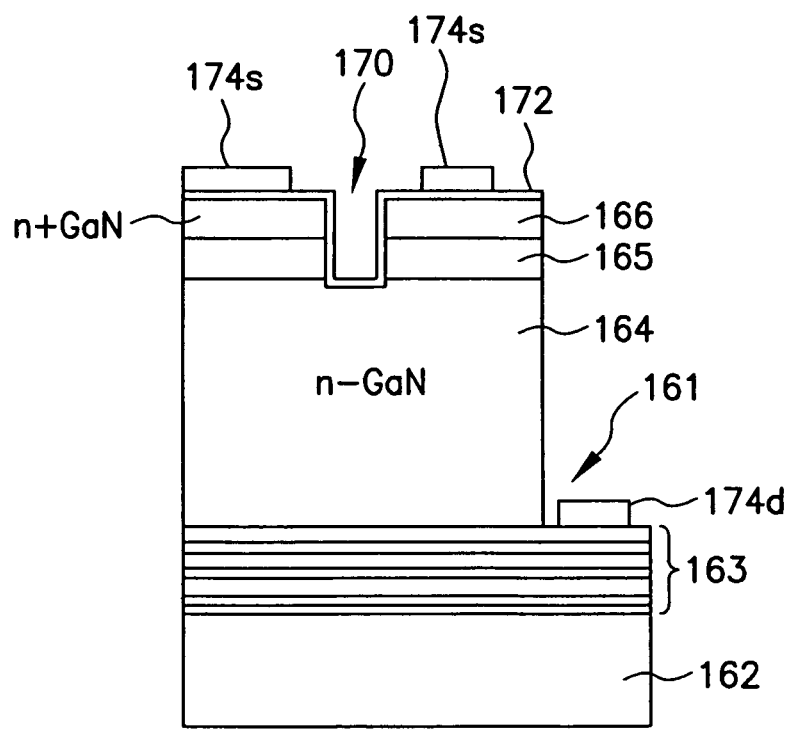

Referring now to FIG. 4F, ohmic contacts 174s and 174d are formed on device 160 to provide good low resistive contacts for current conduction. Ohmic contacts 174s are formed as source contacts atop layer 172, while contact 174d, formed as a drain contact, is formed on step 161. The formation of ohmic contacts 174s, 174d may include a high temperature processing technique to obtain low resistive contacts. Prior to the formation of ohmic contacts 174s, 174d, a protective layer may be formed over device 160 that tends to reduce or eliminate the outdiffusion of nitrogen from layers 163-166 during the high temperature processing technique used to form the ohmic contacts. Ohmic contact 174s, 174d may be formed according to any known technique suitable for use in the III-nitride material system. Ohmic contact 174s and 174d may be composed of ohmic metals or other conductive materials.

Figure 4G:
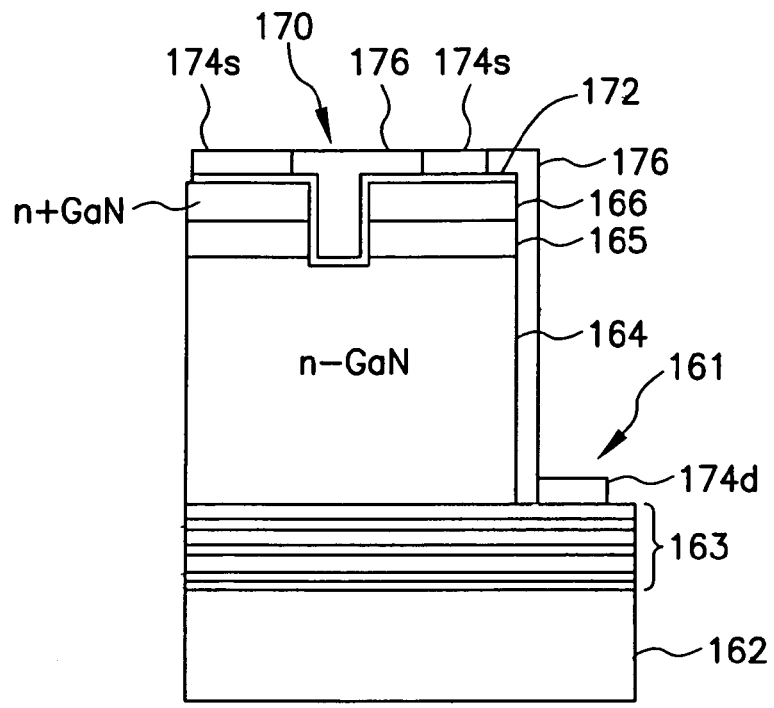

Referring now to FIG. 4G, an insulation material layer 176 is deposited and patterned on device 160 according to known techniques. Insulator 176 is deposited into trench 170, and will be the basis for the formation of a gate dielectric in later processing steps. Insulator 176 is also deposited along the horizontal portion of step 161 to contribute to protecting and passivating layers 164-166 of device 60. Insulator 176 is also interposed between ohmic contact 174d and layer 164, so that conduction in device 160 is provided through stack 163, which is capable of carrying high amounts of current.

Figure 4H:
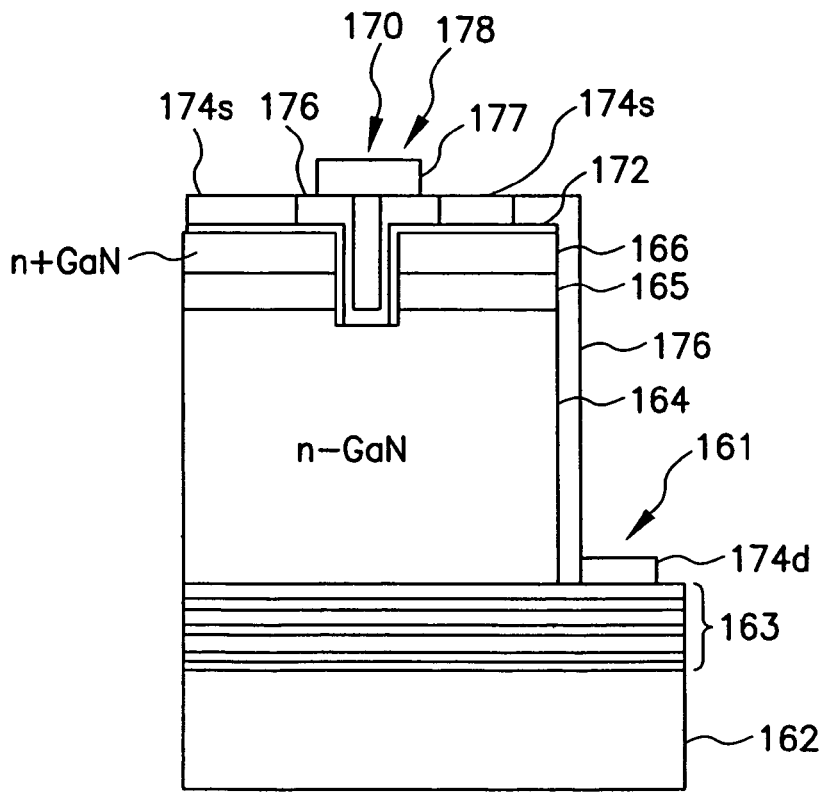

Referring now to FIG. 4H, insulator 176 deposited into trench 170 is etched or otherwise processed to form a trench 178 within insulator 176 in trench 170. Trench 178 is formed in insulator 176 to permit insulator 176 to line trench 170 and act as a gate dielectric for device 160. After the formation of trench 178, a conductive gate material 177 is deposited into trench 178 to provide a gate contact. Material 177 may be any suitable conductive material for operation of the gate electrode, including polysilicon and conductive metals. Gate contact 177 is operable to induce a 2DEG along sidewalls of trench 170 when an electric potential is applied to gate contact 177. By inducing a 2DEG on the sidewalls of trench 170, a conduction channel is formed between source contacts 174s and layer 164 to provide a path for current to stack 163 and drain contact 174d.

Figure 4I:
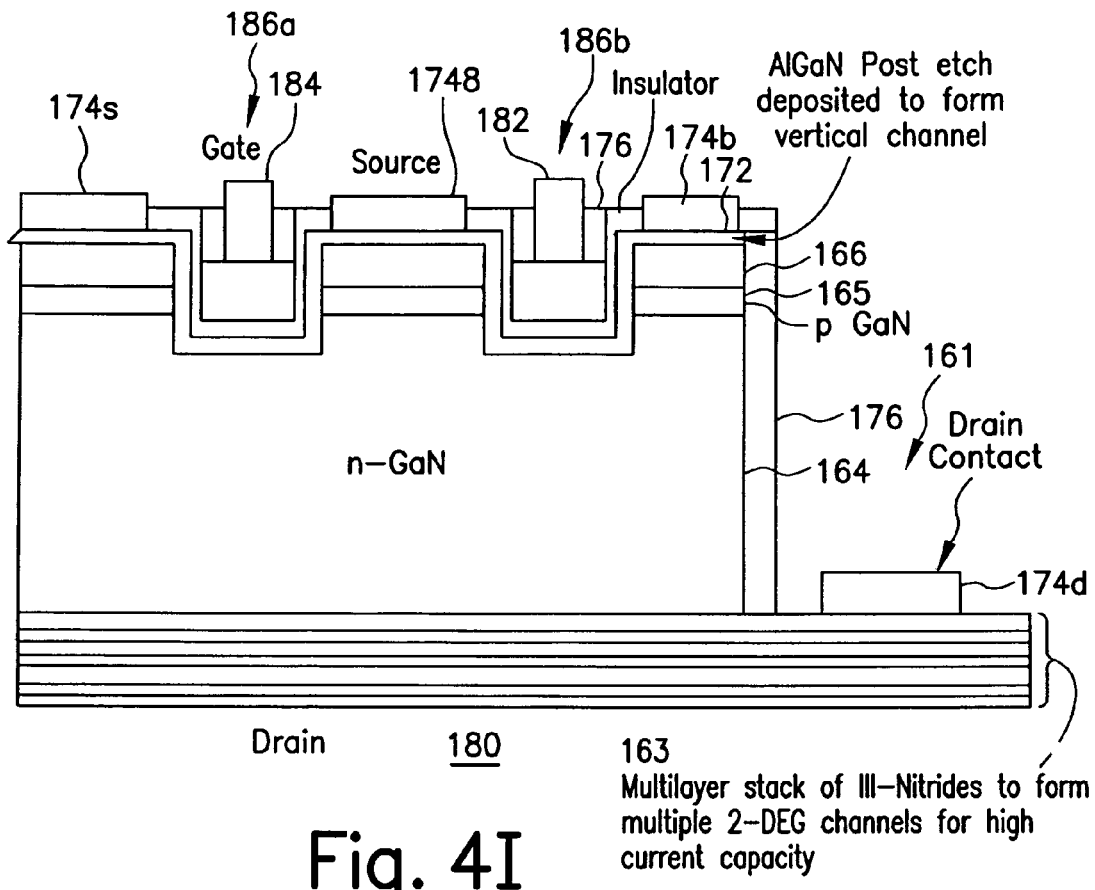

Referring now to FIG. 4I, a completed horizontal conduction III-nitride device 180 is illustrated with two gate electrodes 182, 184, in trenches 186b, 186a, respectively. Device 180 permits high current conduction from source contacts 174s to drain contact 174d when gates 182, 184 are activated to induce a conduction channel along the sidewalls of trenches 186a, 186b. It should be apparent that gate electrodes 182, 184 may be operated independently of each other, or may be timed together to a common electrode. Accordingly, gate contacts 182, 184 may be operated independently to form workall conduction channels in only portions of device 180. However, when gate electrodes 182, 184 are operated in conjunction with each other, a 2DEG conduction channel is formed over the circuits of layer 172, permitting horizontal current flow between layers 164-166, which permits the conductive current to be balanced and achieve a higher current density. In operation, current in device 1800 flows into source electrode 174s into highly doped layer 166, along sidewalls of trenches 186a, 186b and into body layer 164. The conduction channels along the sidewalls of trenches 186a, 186b are induced when an electric potential is applied to the gate contacts 182, 184. The number of source and gate contacts per cell in device 180 depends upon the conductivity of multilayer stack 163, related to current carrying capability. Multilayer stack 163 includes alternating III-nitride materials to form multiple 2DEG conduction channels for high current capacity. Device 180 may be completed according to known techniques for cladding, insulation or protective layers, including the formation of source, drain and gate electrodes and contacts.

Figures 5A, 5B:
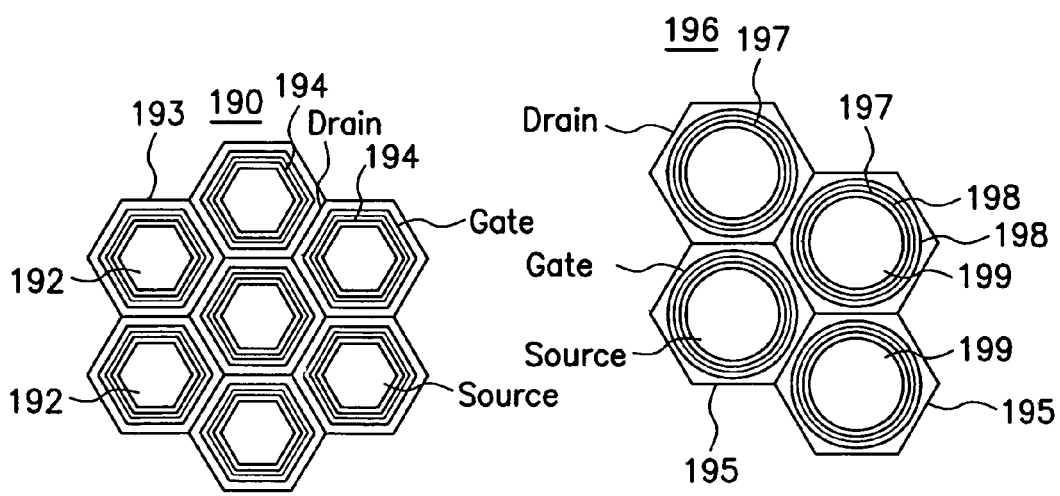
FIGS. 5A-5B is a plan view of trench devices having particular geometries in accordance with the present invention.

Referring now to FIGS. 5A-5B, plan views of multi cellular devices 185, 186, are illustrated with different cellular geometries. Devices 185, 186 are formed with insulating or resistive substrates, and conduct in a lateral or horizontal direction, rather than vertically. Device 185 has cellular components in the form of polygons, such as hexagons, that are equilateral or symmetrical in shape. Devices 185, 186 include gate electrodes 184, 187 respectively, that may be operated independently, or in conjunction with each other. Device 190 also includes drain electrodes 193 that surround the perimeter of each of the cells of device 190. Accordingly, drain contacts 193 may be all connected together. Device 190 also includes source contacts 192 that may also be connected together. Accordingly, device 190 can be formed with a high density cellular structure according to the hexagonal geometry illustrated.

Referring to FIG. 5B, gate electrodes 197 are provided in a circular geometry, surrounded by insulator material 198, also in a circular geometry. Source electrodes 199 are also circular in nature, while drain contacts 195 are in the shape of polygons, in particular hexagons. The geometry of the cellular portions of device 196 can contribute to reduced electric field potential at particular points to improve the device breakdown voltage and other device characteristics. It should be apparent that a number of geometries may be used for the array of cells in the disclosed devices, including square, rectangular, linear and so forth. In addition, the cellular portions of devices 190, 196 may be formed in hexagonal, circular, linear, oval and any other particular geometrical shape depending on the desired device characteristics.

The construction of ohmic contacts, schottky contacts, insulator layers and metallized contacts may be performed according to known techniques. In addition, passivation layers and cladding may be applied to the devices described herein, as well as techniques for forming contacts to current carrying electrodes and gates to provide a finished device.

In addition, the electrodes described herein may be formed with a low resistive ohmic contact process that further improves the operational characteristics of the described devices.

Figure 6:
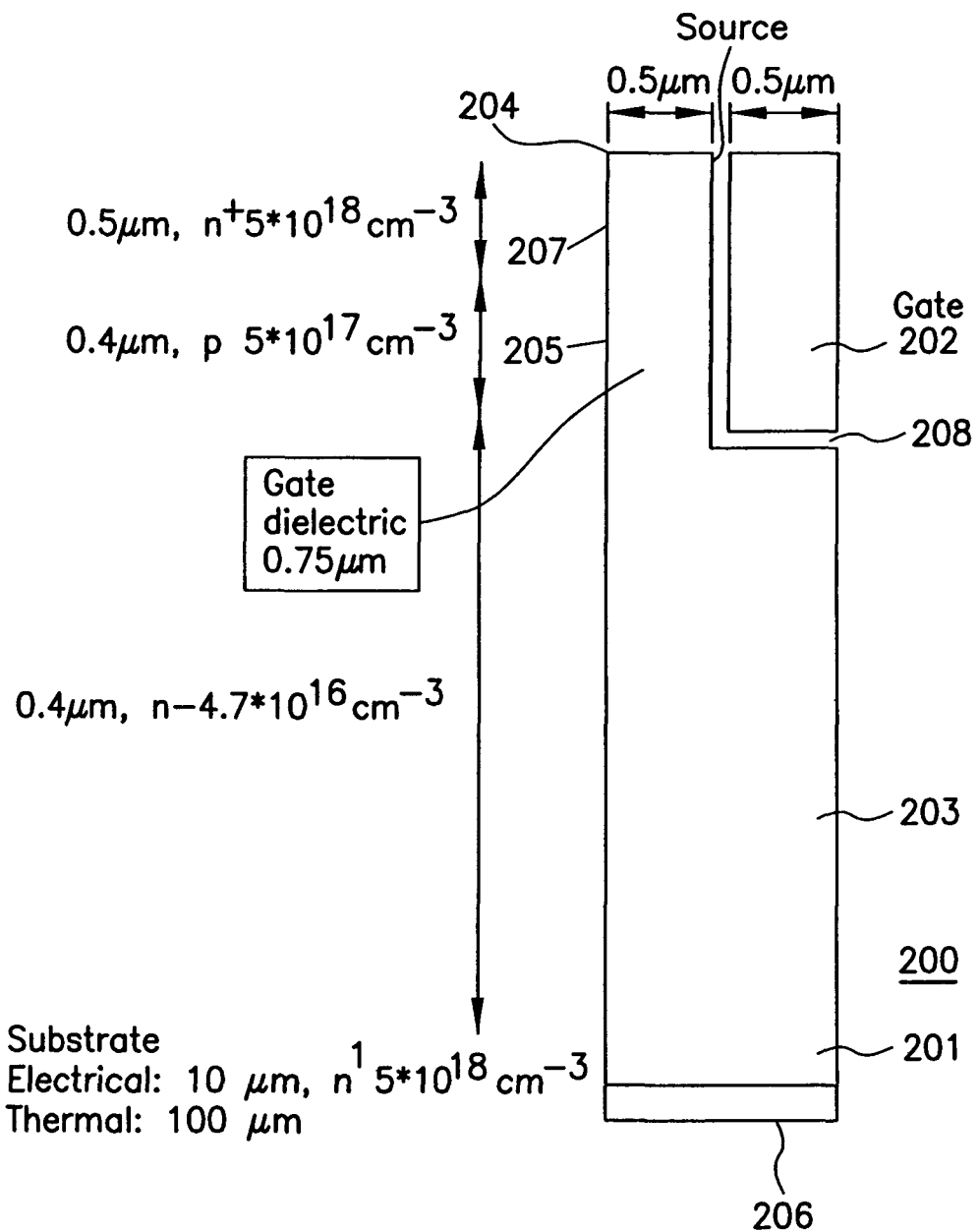
FIG. 6 is partial cross sectional view of a vertical conduction device in accordance with the present invention.

Referring now to FIG. 6, a portion of the cross-section of a vertical conduction device 200 is shown. Device 200 is a field effect device, with a gate 202, a source 204 and a drain 206. Device 200 also includes a gate dielectric 208 that provides insulation from the remainder of the device, while permitting gate 202 to affect the semiconductor material surrounding it to form an invertible channel when an electric potential is applied to gate 202. Device 200 is a III-nitride device that includes a conductive substrate 201, a body layer 203, a blocking layer 205 and a highly doped conducting layer 207. Device 200 is similar in structure and operation 130, 150, 160 and 180 as described above. Accordingly, substrate 201 is a highly doped N$^+$ substrate, while layer 203 is a lightly doped N$^-$ layer. Layer 205 is a P-type material, while layer 207 is a highly doped N-type material. In an exemplary embodiment, layer 201 has a dopant concentration of $5 \times 10^{18}$ cm$^{-3}$, layer 203 has a dopant concentration of $4.7 \times 10^{16}$ cm$^{-3}$, layer 205 has a dopant concentration of $5 \times 10^{17}$ cm$^{-3}$ and layer 207 has a dopant concentration of $5 \times 10^{18}$ cm$^{-3}$. In this exemplary embodiment, layer 201 is approximately 10 microns, layer 203 is approximately 4.5 microns, layer 205 is 0.4 microns and layer 207 is 0.5 microns. The gate dielectric layer 208 separating the gate from the remainder of device 206 may have an exemplary thickness of from approximately 0.1 to approximately 0.75 microns.

Due to the large dielectric breakdown field of greater than 2.2 MV/cm in III-nitride semiconductors, devices fabricated in the III-nitride material system are extremely useful for power control. However, III-nitride semiconductors do not have a native oxide that is suitable as a gate dielectric material. It is well known that III-nitride semiconductor materials do not behave according to the well developed models provided for Si, GaAs, InP and other thorough investigated materials. However, it is possible to construct III-nitride materials according to particular techniques to obtain a surface that is self passivating, where the surface interface is nearly ideal. The interface properties of III-nitride devices play a critical role in the electrical behavior of devices fabricated in the III-nitride material system. One particular type of device that can take advantage of the characteristics of III-nitride semiconductor materials is a MISFET, where the behavior of the device is determined by the interaction of the semiconductor material with the gate dielectric. Due to the self passivating effect of the III-nitride material, a material used as a gate dielectric is decoupled from the semiconductor material, thereby allowing a wide choice of materials for the gate dielectric. A MISFET device may also take advantage of the large band gap of III-nitride materials to diminish the effects of surface and fixed charges that would otherwise have a significant impact in a corresponding silicon device.

In prior known devices, gate dielectrics composed of silicon dioxide or silicon nitride were commonly used for silicon based devices. However, due to the large dielectric breakdown field of greater than 2.2MV/cm that III-nitride semiconductors are capable of withstanding, gate dielectric material with greater withstanding properties are indicated. That is, conventional dielectrics are apt to rupture or breakdown when exposed to the high electric fields produced in the III-nitride semiconductor devices contemplated according to the present invention. Accordingly, alternate materials for gate dielectric layer 208 are considered in accordance with the present invention. Some examples of gate dielectric materials that may be advantageous in accordance with the present invention are zirconium oxide, lanthanoid group oxides, diamond, AlN, piezoelectric and pyroelectric materials, in addition to electret materials that can withstand the higher electric fields generated in the III-nitride semiconductor devices in accordance with the present invention. According to a feature of the present invention, trench surface layers 203, 205 and 207 may be self passivated to decouple the dielectric material from the III-nitride semiconductor material, to reduce the electric field that the gate dielectric material is exposed to.

According to a feature of the invention, gate dielectric 208 is composed of a material that is deposited using a low temperature process, such as Gd oxide or Mg oxide, where layers 203, 205 and 207 are self passivated.

Figure 7:
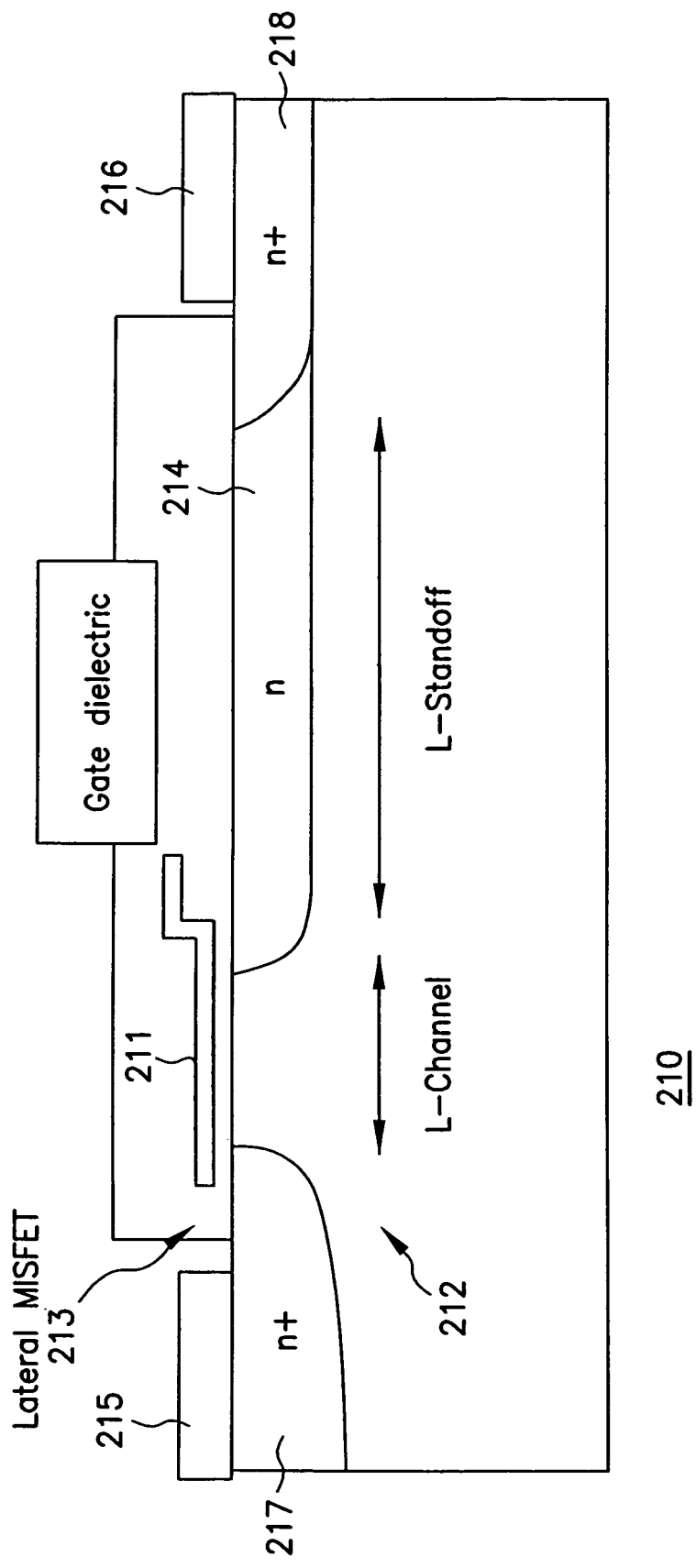
FIG. 7 is a cross-sectional view of a lateral conduction device in accordance with the present invention.

Referring now to FIG. 7, a lateral III-nitride device 210 is illustrated, with an invertible channel 212 and a standoff region 214. Ohmic contacts 215, 216 provide the conduction points for permitting current to flow into and out of device 210. Contacts 215, 216 are disposed atop highly doped N$^+$ regions 217, 218, respectively, which are composed of a III-nitride material, preferably GaN. Standoff region 214 includes an N-type doping of a III-nitride material, preferably GaN. A gate electrode 211 resides over channel 212, separated from channel 212 from gate dielectric layer 213. As with device 200 (FIG. 6), device 210 experiences high electric fields when blocking voltage, that is, when gate electrode 211 is not activated. In this instance, channel 212 prevents conduction of current between contacts 215, 216 and a large electric field is generated between contacts 215, 216 and gate electrode 211. Under these circumstances, gate dielectric 213 must be capable of withstanding the high electric field and prevent or substantially reduce any leakage current through gate electrode 211. Accordingly, gate dielectric 213 is composed of a material that is capable of withstanding high electric fields without breakdown, as discussed above, and may be provided over a passivated surface of regions 212, 214, 217 and 218. By providing a passivated surface in these regions, the electric field experienced by gate dielectric 213 can be diminished to a level where lower dielectric breakdown materials may be used. This advantageous feature of the present invention permits the use of well known dielectric materials that have a long and well developed history of use in the manufacture of semiconductor devices. The use of these known materials implies that cost can be reduced while a robust device can be produced.

Figure 8A:
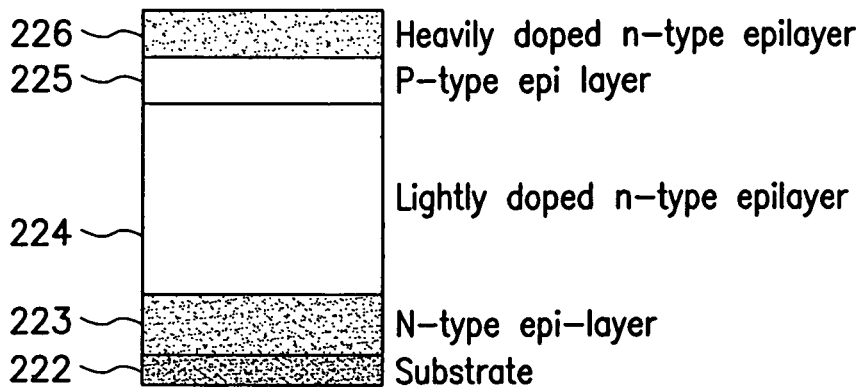
FIGS. 8A-8E are partial cross sectional views of a vertical conduction device and method for forming the same with passivation and a gate dielectric and in accordance with the present invention.

Referring now to FIGS. 8A-8E, the construction of a III-nitride device 220 in accordance with the present invention is illustrated. Device 220 is a vertical conduction device with a conductive substrate 222 that is composed of a highly doped N$^+$ semiconductor material, which may include silicon, silicon carbide and so forth. An N-type epi layer 223 is optionally grown over substrate 222, and a lightly doped N-type epi layer 224 is formed atop layer 223. Another P-type epi layer 225 is formed over layer 224, and a heavily doped N-type epi layer is formed over layer 225. Layers 222-226 form the basis of a wafer that can be manufactured according to techniques developed for the processing and manufacturing of III-nitride semiconductor materials. Accordingly, FIG. 8A illustrates a useful starting point for the manufacture of specific III-nitride devices.

Figure 8B:
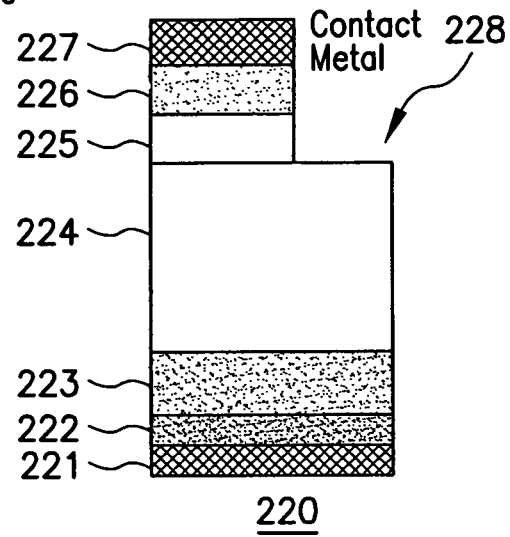

Referring now to FIG. 8B, device 220 is processed for the formation of contacts 221 and 227, where the contact material is deposited and then annealed to form a low resistance contact. Following the formation of contacts 221, 227, device 220 is patterned and etched, or otherwise processed, to form steps 228, which can form a portion of a trench if device 220 is to be constructed as a trench device. The formation of contacts 221 and 227 may be brought about by any known method using suitable materials for conduction of large amounts of current. Step 228 may be formed according to any known method, and may be formed to protrude into layer 224, in addition to passing through layers 225-227.

Figures 8C, 8D, 8E:
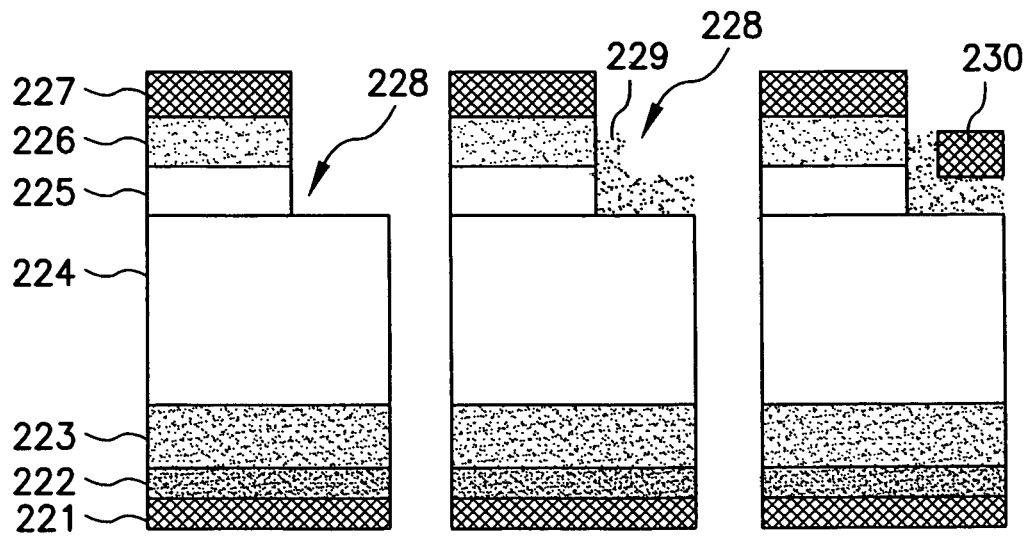

Referring now to FIG. 8C, device 220 undergoes a passivation step in accordance with the present invention to permit layers 224-226 to be decoupled from a gate dielectric deposited in step 228. The passivation process results in exposed surfaces of layers 224-226 being close to ideal for the formation of an interface with another material, such as a gate dielectric.

Referring now to FIG. 8D, a gate dielectric 229 is deposited in step 228, and optionally patterned or processed to have a specific thickness or density to obtain particular characteristics. For example, gate dielectric 229 may be formed as a block of dielectric material deposited in the entire area of step 228, and then patterned and etched to leave dielectric material 229 along the walls of layers 225-226 and the top of layer 224 in the location of step 228. Any particular type of process may be used to form gate dielectric 229, and the materials used may be any of those discussed above, or other dielectric material that have a suitably high breakdown value or dielectric constant to permit device 220 to withstand high voltages without gate dielectric breakdown, in conjunction with passivated surfaces of layers 224-226.

Referring now to FIG. 8E, a gate contact is deposited adjoining gate dielectric 229 to form a field effect device. Gate material 230 may be formed of conductive material including metals and doped semiconductor material. Any known type of process may be employed to form gate contact 230, including masking and deposition according to a number of techniques.

Device 220 operates with the presence or absence of an electrical potential on gate contact 230. When an electrical potential is applied to gate contact 230, the resulting electric field induces a conduction channel through layer 225 to provide a conduction path from contact 227 to contact 221. In the absence of an electric potential on gate contact 230, no electric field is generated, and no conduction channel is formed, permitting device 220 to stand off significant voltage. As the voltage device 220 stands off increases, a large electric potential is developed between gate contact 230 and contact 227, for example. The electric potential can increase significantly due to the ability of the III-nitride materials in layers 222-226 to withstand high voltages. However, gate dielectric 229 must be able to provide a high level of isolation, or exhibit a high breakdown voltage value to obtain the best performance possible with device 220. By subjecting device 220 to a passivation for layers 224-226, a newly ideal interface is formed between gate dielectric 229 and III-nitride layers 224-226. Accordingly, gate dielectric 229 is decoupled from layers 224-226, and is not subjected to the high electric fields that may cause dielectric 229 to break down. The self passivated materials of layers 224-226 bear the electric field potential, and serve to disperse or balance high electric field to prevent gate dielectric 229 from being overstressed.

In addition, gate 229 may be composed of materials that exhibit a high dielectric breakdown, such as those discussed above, to further improve the performance of device 220. The selection of dielectric material 229 relates to the breakdown voltage device 220 may achieve, as well as the threshold voltage, speed and power rating of device 220.

Figure 9A:
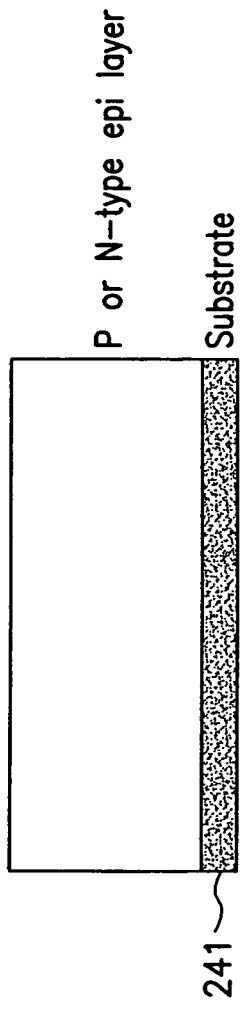
FIGS. 9A-9G are partial cross sectional views of a lateral conduction device and method for forming the same with passivation and a gate dielectric and in accordance with the present invention.
Figure 9D:
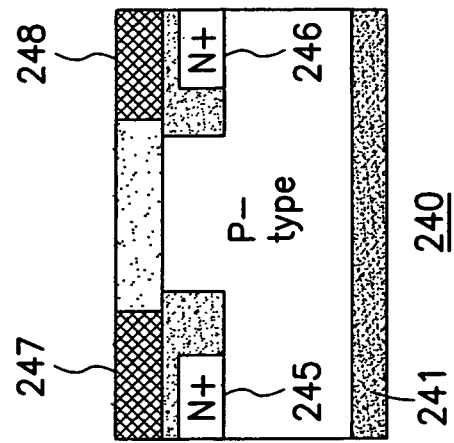
Figure 9C:
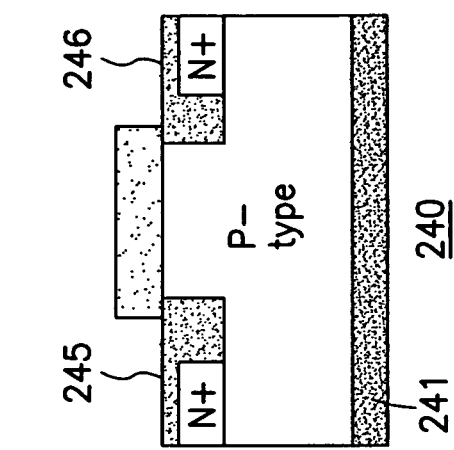
Figure 9B:
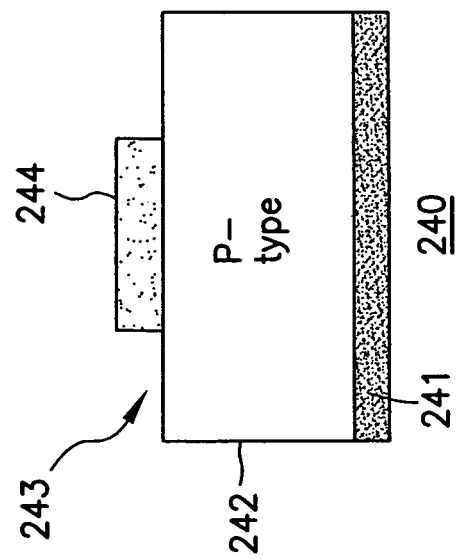

Referring now to FIGS. 9A-9G, the formation of a III-nitride lateral, or horizontal, conduction device 240 is illustrated. Device 240 includes a substrate 241 and an epi layer that is doped according to the type of device desired. For example, as with all the devices discussed in the present disclosure, N or P channel type devices may be constructed in accordance with the structures of the present invention using III-nitride semiconductor materials. Device 240 is illustrated and this exemplary embodiment as an N channel type device, and that may be enhancement or depletion mode in operation. Referring now to FIG. 9B, a top surface 242 of device 240 is first provided with surface protection to prevent damage to layer 242 during subsequent processing. A surface protection may take the form of the deposition of a thin, nitrogen rich layer that prevents the outdiffusion of nitrogen from layer 242, for example.

After surface 243 is protected, a dielectric material 244 is deposited and patterned to form a gate dielectric for device 240. Referring now to FIG. 9C, $N^+$ regions 245, 246 are formed according to known techniques, such as ion implantation or diffusion. During the formation of regions 245, 246, gate dielectric 244 may act as a mask to permit the patterning of regions 245, 246 without additional processing.

Referring now to FIG. 9D, contacts 247, 248 are formed over regions 245, 246, and may be in the form of ohmic contacts that are deposited, patterned and annealed to form a low resistance contact for device 240. Contacts 247, 248 may be referred to interchangeably as source and drain contacts, or simply ohmic contacts.

Figure 9E:
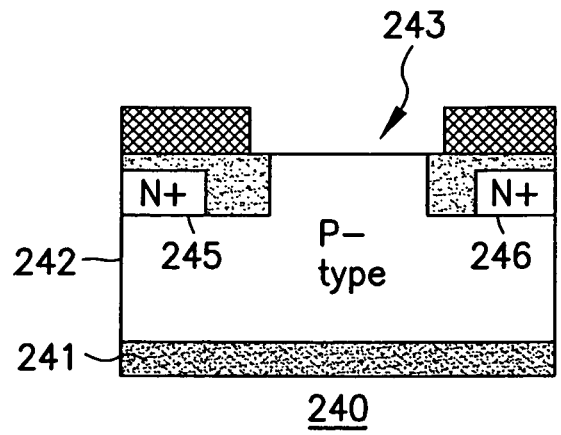
Figure 9F:
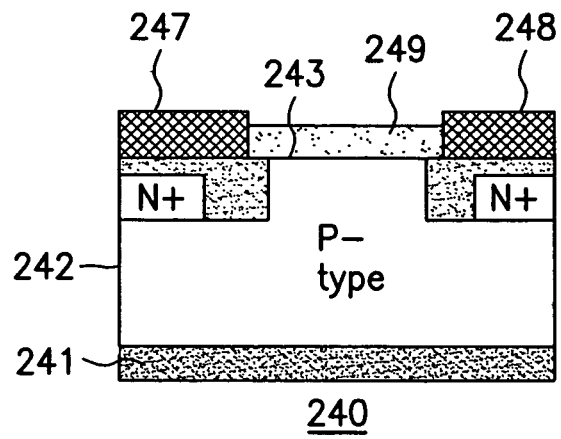

Referring now to FIG. 9E, dielectric material 244 is removed after a further surface protection step to prevent damage to layer 242 or regions 245, 246. Referring now to FIG. 9F, the resulting device with layer 242 and regions 245, 246 exposed is then processed to passivate device 240 to provide a near ideal surface 243 referred to above as self passivated. This nearly ideal surface 243 permits layer 242 and regions 245, 246 to be decoupled from a later formed gate dielectric, to permit lower dielectric constant materials to be used as gate dielectrics. After the passivation process, gate dielectric 249 is deposited over device 240, and patterned and processed to provide a dielectric layer between contacts 247 and 248. Gate dielectric 249 may be composed of any material suitable for withstanding a high electric field and providing a high voltage breakdown, as discussed above. The passivation step applied to surface 243 results in lower electric fields experienced by gate dielectric 249, so that lower dielectric constant materials may be used.

Figure 9G:
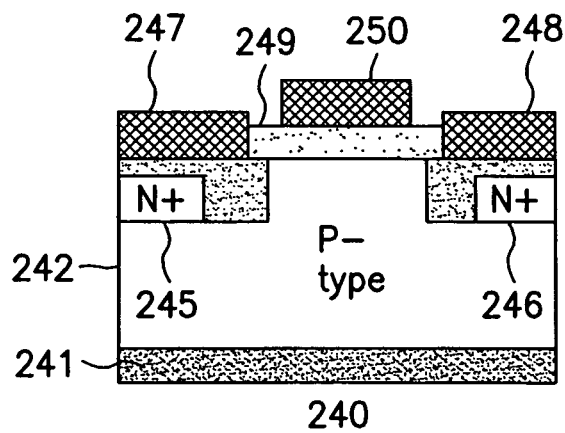

Referring now to FIG. 9G, device 240 is functionally completed with a gate contact 250 deposited over gate dielectric 249, and isolated from contacts 247, 248. In operation, device 240 conducts current or blocks voltage depending upon whether an electric potential is applied to gate contact 250. When no electric potential is applied to gate 250, no conductive channel is formed between regions 245 and 246, preventing conduction in device 240, and permitting device 240 to withstand high voltages. When an electric potential is applied to gate contact 250, a conductive channel is formed in P-type layer 242 from region 245 to region 246, to permit current flow between contacts 247 and 248. Note that device 240 is a bi-directional device.

Due to the high voltages that device 240 withstands when blocking voltage, dielectric 249 must be capable of withstanding high electric fields without breakdown. During voltage blocking operation, device 240 develops potentially high electric fields and electric potentials between gate contact 250 and contacts 247, 248. These high electric fields can rise to the level of dielectric breakdown with respect to dielectric 249 due to the nature of the blocking capability of the III-nitride semiconductor materials. However, due to the passivation of surface 243 prior to the deposition of gate dielectric 249, gate dielectric 249 is decoupled from the III-nitride materials composing regions 245, 246 and layer 242. Accordingly, device 240 is able to obtain better performance using conventional gate dielectric material for a gate dielectric 249 than is possible with conventional devices where self passivation is not available.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for forming a III-nitride field effect device, comprising:
   depositing alternating layers of a first III-nitride material and layers of a second III-nitride material to form a multilayer stack having a 2DEG at each of a plurality of heterointerfaces between the layers of the first III-nitride material and the layers of the second III-nitride material;
   providing a plurality of doped III-nitride layers over said multilayer stack, said plurality of doped III-nitride layers forming at least one PN junction over said multilayer stack;
   performing a self-passivation in a surface of the III-nitride layer before deposition of a gate dielectric.

2. The method according to claim 1, wherein the passivation is performed with a nitrogen plasma anneal.

3. The method according to claim 1, wherein the performing of the self-passivation further comprises:
   depositing an encapsulant material containing nitrogen on a surface to be passivated; and
   annealing the encapsulant material.

4. The method according to claim 1, wherein the self-passivation is performed with a photo-electro-chemical etch.

5. The method according to claim 1, wherein the device is a bi-directional device.

6. The method according to claim 1, wherein the device is a nominally ON device.

7. The method according to claim 1, wherein the device is a nominally OFF device.

8. The method according to claim 1, wherein the device is a vertical conduction device.

9. The method according to claim 1, wherein the gate dielectric material comprises Gd oxide.

10. The method according to claim 1, wherein the gate dielectric material comprises Mg oxide.

11. A method for forming a III-nitride field effect device, comprising:
    doping a layer under a first gate dielectric material using the first gate dielectric material as a mask, the first gate dielectric material situated over a surface protection layer;
    removing the first gate dielectric material and self-passivating a channel region of the III-nitride field effect device; and
    depositing and patterning a second gate dielectric material over the self-passivated channel region to form a gate dielectric.

12. The method according to claim 11, wherein the second gate dielectric material comprises zirconium oxide.

13. The method according to claim 11, wherein the second gate dielectric material comprises a lanthanoid group oxide.

14. The method according to claim 11, wherein the second gate dielectric material comprises diamond.

15. The method according to claim 11, wherein the second gate dielectric material comprises a piezoelectric or a pyroelectric material.

16. The method according to claim 11, further comprising forming a trench in the III-nitride field effect device such that the channel region is located on a sidewall of the trench.

17. The method according to claim 16, wherein the second gate dielectric material comprises Gd oxide or Mg oxide.

18. The method according to claim 11, comprising depositing the surface protection layer to form a thin, nitrogen rich layer prior to the depositing of the first gate dielectric over the surface protection layer.

19. The method according to claim 11, wherein the performing of the surface further comprises:
    depositing an encapsulant material containing nitrogen on a surface to be passivated; and
    annealing the encapsulant material.

20. The method according to claim 11, wherein the surface passivation is performed with a photo-electro-chemical etch.

* * * * *